United States Patent
Sokolov et al.

(10) Patent No.: US 9,606,239 B2
(45) Date of Patent: Mar. 28, 2017

(54) DETECTION OF EXCESSIVELY HIGH INTERFERENCE SIGNAL LEVELS DURING RECEPTION OF GLOBAL NAVIGATION SATELLITE SYSTEM SIGNALS

(71) Applicant: Limited Liability Company "Topcon Positioning Systems", Moscow (RU)

(72) Inventors: Andrey Mikhailovich Sokolov, Moscow (RU); Dmitry Vitalievich Tatarnikov, Moscow (RU); Konstantin Mikhailovich Bachmanov, Moscow (RU); Rifat Khaidarovich Yusupov, Moscow (RU)

(73) Assignee: Topcon Positioning Systems, Inc., Livermore, CA (US)

( * ) Notice: Subject to any disclaimer, the term of this patent is extended or adjusted under 35 U.S.C. 154(b) by 0 days.

(21) Appl. No.: 15/113,120

(22) PCT Filed: Dec. 4, 2014

(86) PCT No.: PCT/RU2014/000906
§ 371 (c)(1),
(2) Date: Jul. 21, 2016

(87) PCT Pub. No.: WO2016/089239
PCT Pub. Date: Jun. 9, 2016

(65) Prior Publication Data
US 2017/0010360 A1  Jan. 12, 2017

(51) Int. Cl.
*G01S 19/21* (2010.01)
*G01S 19/36* (2010.01)
*H03F 3/193* (2006.01)

(52) U.S. Cl.
CPC .............. *G01S 19/21* (2013.01); *G01S 19/36* (2013.01); *H03F 3/193* (2013.01);
(Continued)

(58) Field of Classification Search
CPC .......... G01S 19/21; G01S 19/36; H03F 3/193; H03F 2200/294; H03F 2200/165; H03F 2200/168; H03F 2200/451; H03F 2200/411
See application file for complete search history.

(56) References Cited

U.S. PATENT DOCUMENTS

| 5,731,841 A * | 3/1998 | Rosenbaum | H04N 5/21 348/463 |
| 2012/0231729 A1 * | 9/2012 | Xu | G01S 19/21 455/13.4 |
| 2013/0229235 A1 | 9/2013 | Ohnishi | |

OTHER PUBLICATIONS

International Search Report and Written Opinion mailed on Aug. 27, 2015, in connection with International Patent Application No. PCT/RU14/00906, 7 pgs.

* cited by examiner

*Primary Examiner* — Bernarr Gregory
*Assistant Examiner* — Fred H Mull
(74) *Attorney, Agent, or Firm* — Chlesa Shahinian & Giantomasi PC

(57) ABSTRACT

A high-linear amplifier receives, from an input bandpass filter, input signals including weak process signals and strong interference signals, amplifies the input signals, and transmits the amplified signals to an output bandpass filter. The high-linear amplifier includes a transistor and a feedback circuit that stabilizes the operating current of the transistor. The operating current includes the direct-current and low-frequency output signal currents of the transistor. The feedback circuit includes an interference detector that rectifies a portion of the high-frequency output signals of the transistor and extends the linear range of the high-linear amplifier. An interference indicator unit alerts an operator to the presence of excessively high levels of interference before the high-linear amplifier enters the non-linear mode.

(Continued)

Amplified signals rejected by the output bandpass filter are reflected back to the high-linear amplifier stage. A directional coupler prevents the reflected signals from disrupting the operation of the interference detector.

36 Claims, 11 Drawing Sheets

(52) U.S. Cl.
CPC .. *H03F 2200/165* (2013.01); *H03F 2200/168* (2013.01); *H03F 2200/294* (2013.01); *H03F 2200/411* (2013.01); *H03F 2200/451* (2013.01)

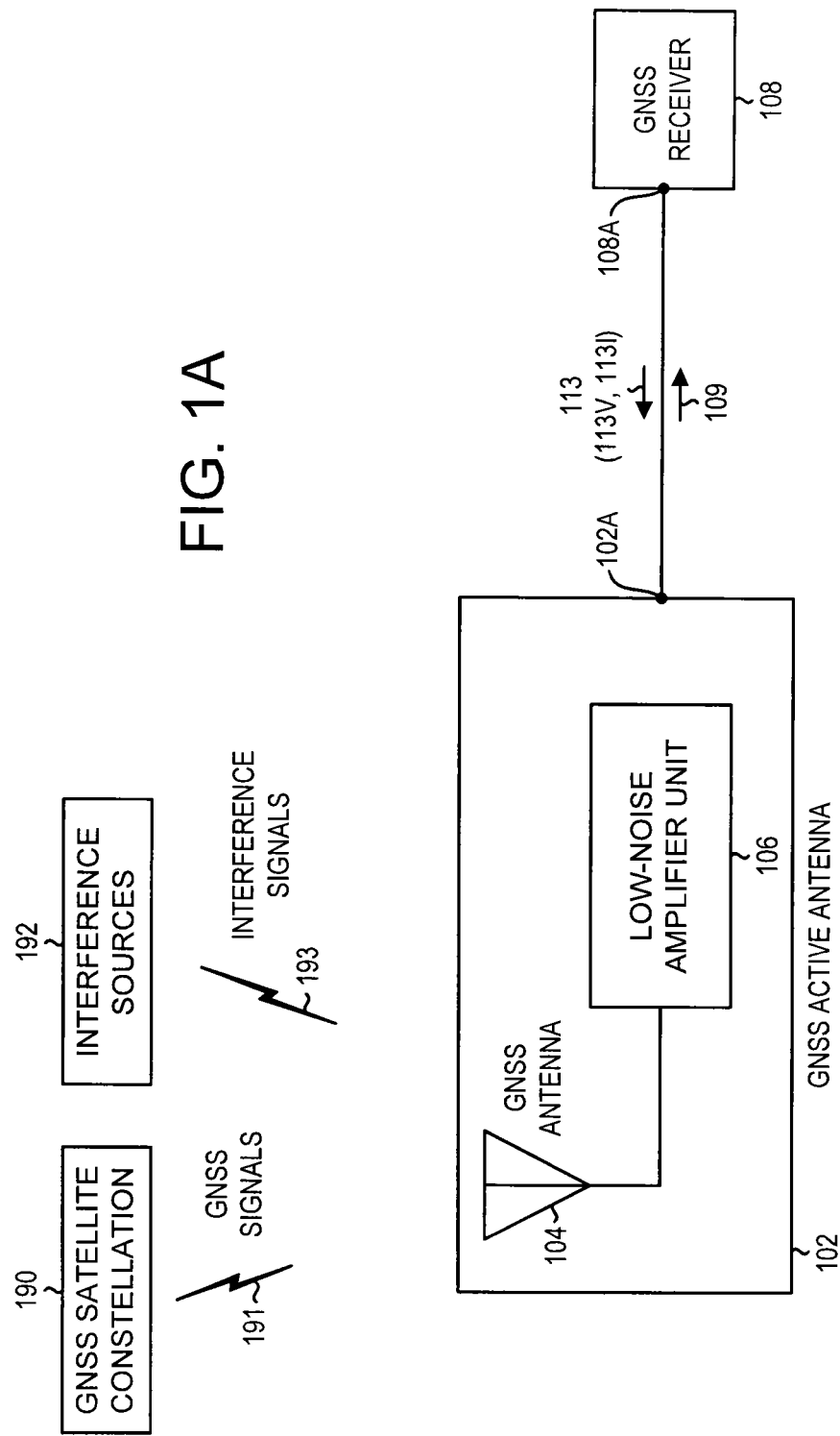

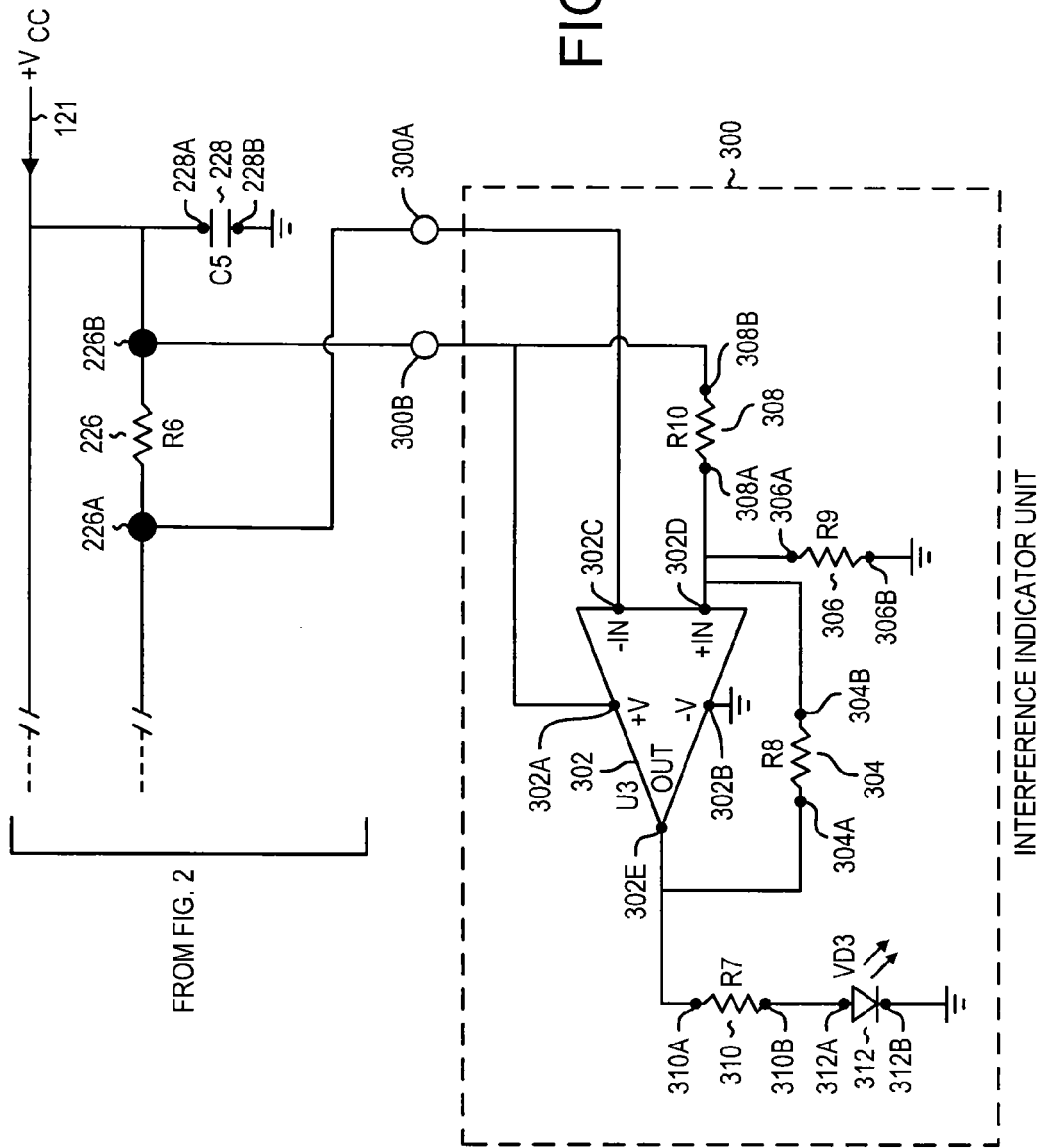

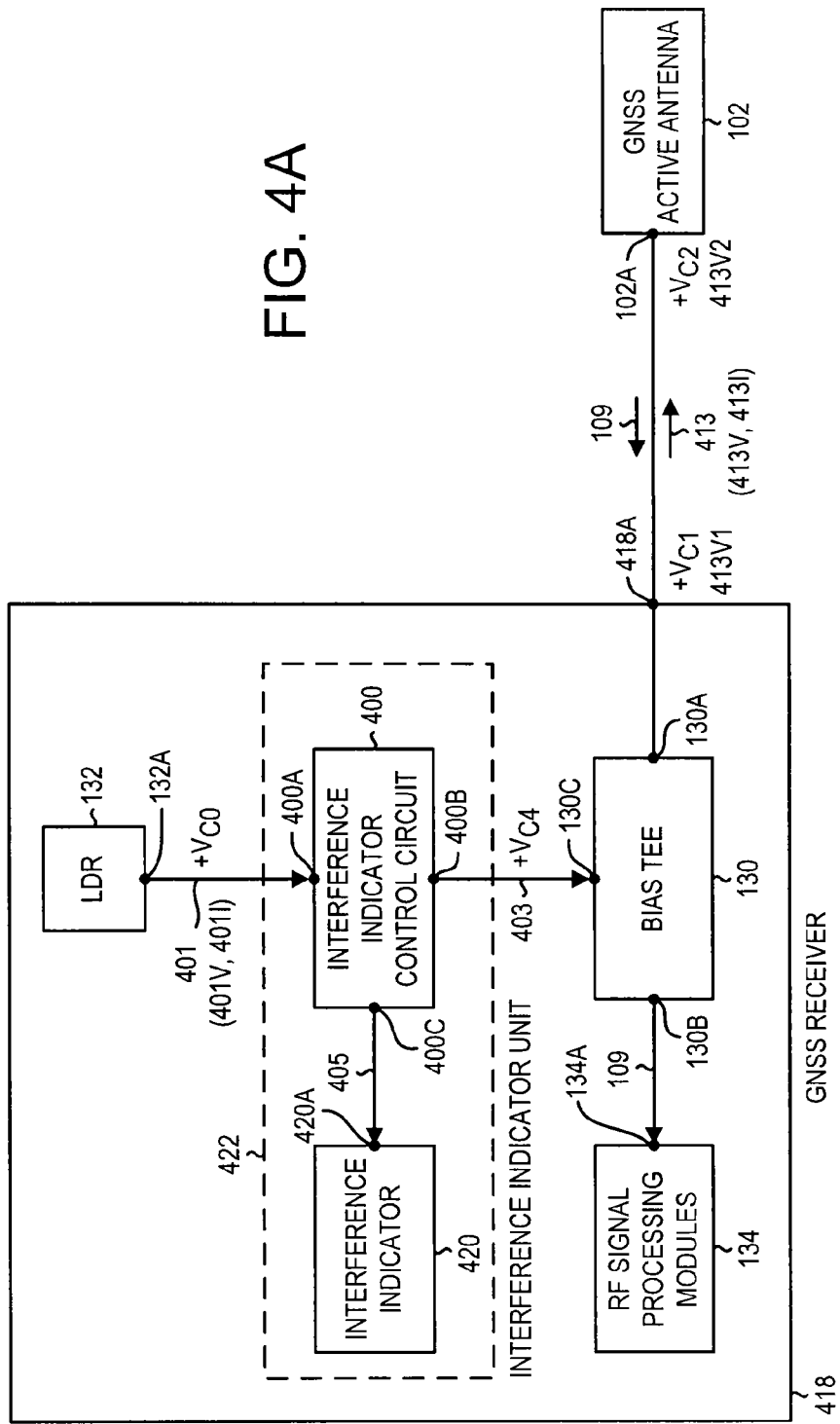

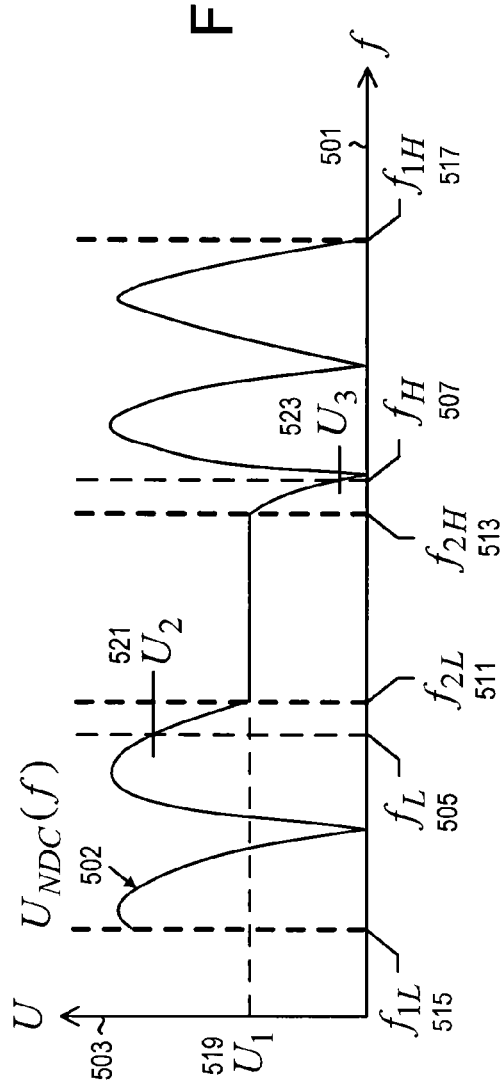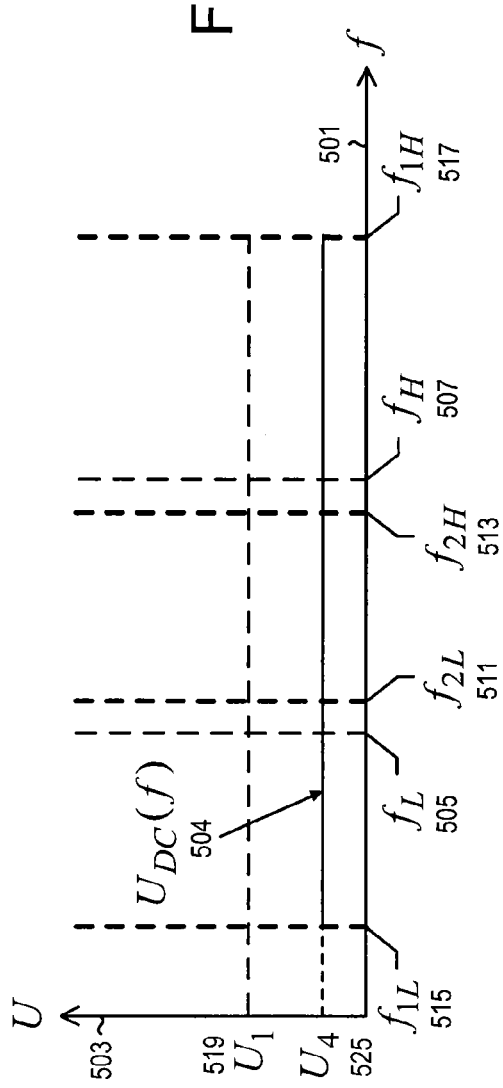

DETECTION OF EXCESSIVELY HIGH INTERFERENCE SIGNAL LEVELS DURING RECEPTION OF GLOBAL NAVIGATION SATELLITE SYSTEM SIGNALS

CROSS-REFERENCE TO RELATED APPLICATIONS

This application is a national stage (under 35 U.S.C. 371) of International Patent Application No. PCT/RU2014/000906, filed Dec. 4, 2014, which is herein incorporated by reference in its entirety.

BACKGROUND OF THE INVENTION

The present invention relates generally to processing of electromagnetic signals, and, in particular, to detection of excessively high interference signal levels during reception of global navigation satellite system signals.

Global navigation satellite systems (GNSSs) can determine positions with high accuracy. Currently deployed global navigation satellite systems are the United States Global Positioning System (GPS) and the Russian GLONASS. Other global navigation satellite systems, such as the European GALILEO system, are under development. In a GNSS, a navigation receiver receives and processes radio signals transmitted by satellites located within a line-of-sight of the receiver. The satellite signals comprise carrier signals modulated by pseudo-random binary codes. The receiver measures the time delays of the received signals relative to a local reference clock or oscillator. Code measurements enable the receiver to determine the pseudo-ranges between the receiver and the satellites. The pseudo-ranges differ from the actual ranges (distances) between the receiver and the satellites due to various error sources and due to variations in the time scales of the satellites and the receiver. If signals are received from a sufficiently large number of satellites, then the measured pseudo-ranges can be processed to determine the code coordinates and coordinate time scales at the receiver. This operational mode is referred to as a stand-alone mode, since the measurements are determined by a single receiver. A stand-alone system typically provides meter-level accuracy.

The accuracy, precision, stability, and reliability of GNSS measurements can be improved by differential navigation measurements relative to a reference base station, by measurements on more than one carrier frequency, and by measurements of the phases of the satellite carrier signals. A differential navigation system that computes positions based on real-time carrier signals, in addition to the code pseudo-ranges, is often referred to as a real-time kinematic (RTK) system. An RTK system can provide accuracies on the order of 1-2 cm.

The signal levels of GNSS signals, however, are relatively low, and interference signals can degrade or disrupt GNSS measurements.

BRIEF SUMMARY OF THE INVENTION

In an embodiment, a high-linear amplifier stage is configured to receive a first plurality of signals from a first bandpass filter, amplify the first plurality of signals to generate a second plurality of signals, transmit the second plurality of signals to a second bandpass filter, and receive a third plurality of signals reflected back from the second bandpass filter. The first bandpass filter has a first low cutoff frequency and a first high cutoff frequency; the second bandpass filter has a second low cutoff frequency and a second high cutoff frequency; the second low cutoff frequency is greater than the first low cutoff frequency; and the second high cutoff frequency is less than the first high cutoff frequency.

The high-linear amplifier stage includes:
a high-linear transistor with:
a transistor output terminal; and
a transistor control terminal;
an operational amplifier with:
an operational-amplifier inverting terminal;
an operational-amplifier non-inverting terminal; and
an operational-amplifier output terminal;
a rectifier circuit with:
a rectifier-circuit input terminal;
a rectifier-circuit first output terminal; and
a rectifier-circuit second output terminal; and
a directional coupler with:
a directional-coupler incident terminal;
a directional-coupler output terminal;
a directional-coupler coupled terminal; and
a directional-coupler load terminal.

A feedback resistor is connected across the operational-amplifier output terminal and the operational-amplifier inverting terminal. A load resistor is connected from the directional-coupler load terminal to electrical ground. A matching resistor is connected from the directional-coupler coupled terminal to electrical ground.

In response to receiving a plurality of control signals at the transistor control terminal, in which the plurality of control signals is based at least in part on the first plurality of signals, and in which the plurality of control signals includes a direct-current control signal, a plurality of low-frequency control signals, and a plurality of high-frequency control signals, the high-linear transistor transmits a plurality of transistor output signals from the transistor output terminal. The plurality of transistor output signals includes:
a direct-current transistor output signal voltage;
a direct-current transistor output signal current;
a plurality of low-frequency transistor output signal voltages;
a plurality of low-frequency transistor output signal currents;
a plurality of high-frequency transistor output signal voltages; and
a plurality of high-frequency transistor output signal currents.

The directional-coupler incident terminal receives a directional-coupler incident signal that includes the plurality of high-frequency transistor output signal voltages and the plurality of high-frequency transistor output signal currents. The directional-coupler output terminal receives a directional-coupler output signal that includes a first portion of the directional-coupler incident signal; the second plurality of signals is based at least in part on the directional-coupler output signal. The directional-coupler coupled terminal receives a directional-coupler coupled signal that includes a second portion of the directional-coupler incident signal.

The rectifier-circuit input terminal receives from the directional-coupler coupled terminal a rectifier-circuit input voltage based at least in part on the plurality of high-frequency transistor output signal voltages. When the rectifier-circuit input voltage exceeds a specified rectifier-circuit threshold voltage, the rectifier circuit outputs a rectifier-circuit output voltage across the rectifier-circuit first output terminal and the rectifier-circuit second output terminal, in which the rectifier-circuit output voltage is based at least in part on the rectifier-circuit input voltage.

The operational-amplifier non-inverting terminal receives an operational-amplifier non-inverting-terminal voltage based at least in part on an operating current comprising a sum of the direct-current transistor output signal current and the plurality of low-frequency transistor output signal currents. The operational-amplifier inverting terminal receives an operational-amplifier inverting-terminal voltage based at least in part on an operational-amplifier inverting-terminal reference voltage and based at least in part on the rectifier-circuit output voltage. The operational-amplifier output terminal outputs an operational-amplifier output signal based at least in part on a difference between the operational-amplifier non-inverting-terminal voltage and the operational-amplifier inverting-terminal voltage. The direct-current transistor control signal and the plurality of low-frequency transistor control signals are based at least in part on the operational-amplifier output signal.

These and other advantages of the invention will be apparent to those of ordinary skill in the art by reference to the following detailed description and the accompanying drawings.

BRIEF DESCRIPTION OF THE DRAWINGS

FIG. 1A shows a high-level functional block diagram of an embodiment of a system for receiving and processing global navigation satellite system signals;

FIG. 3A-FIG. 3C show a circuit diagram of a first embodiment of an interference indicator unit connected to a low-noise amplifier unit;

FIG. 4A shows a high-level functional block diagram of a second embodiment of a global navigation satellite system receiver, including a second embodiment of an interference indicator unit;

FIG. 5A shows a plot of signal voltage as a function of signal frequency for an embodiment of a first amplifier stage without a directional coupler;

FIG. 5B shows a plot of signal voltage as a function of signal frequency for an embodiment of a first amplifier stage with a directional coupler;

DETAILED DESCRIPTION

Figure 1B:
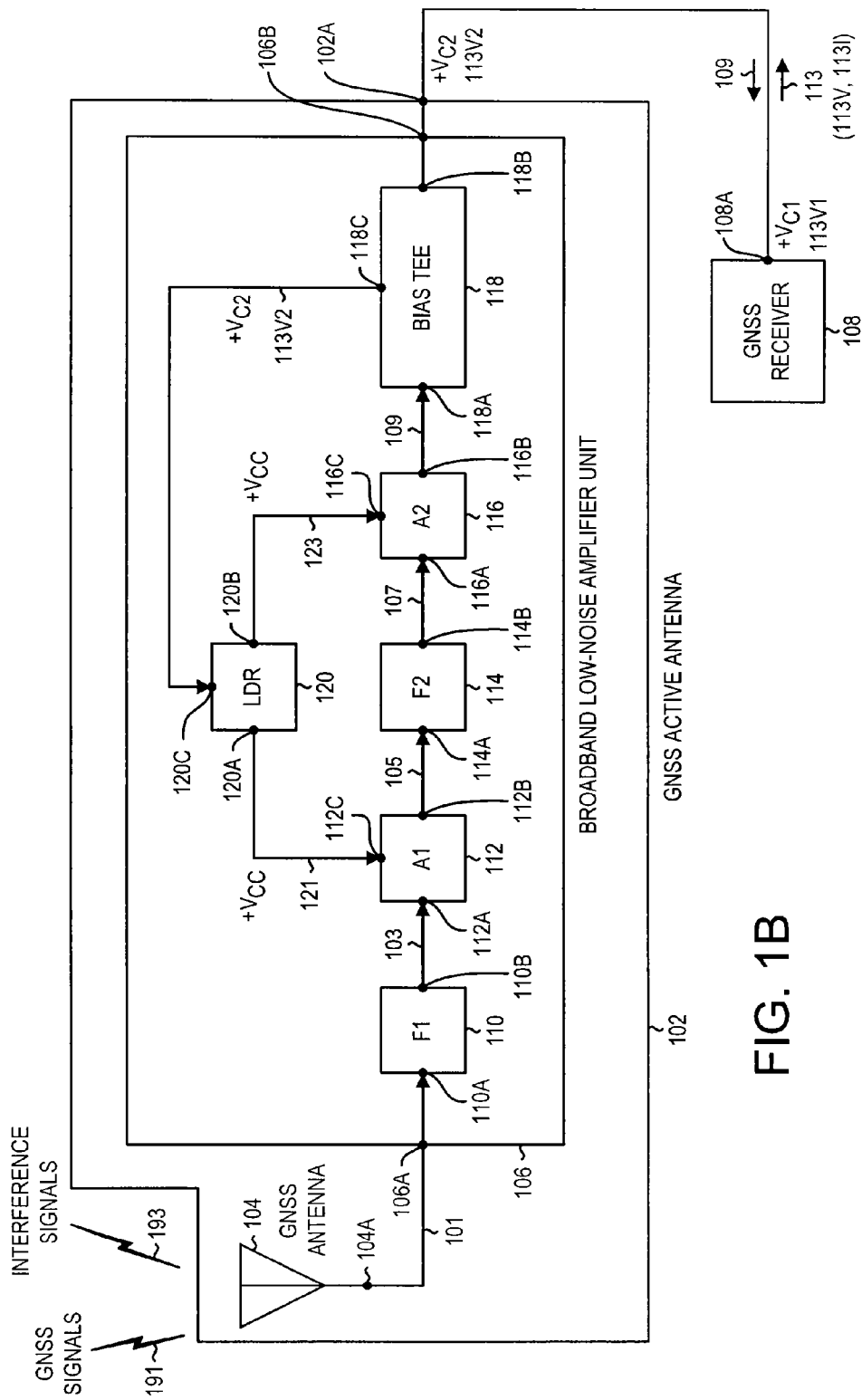
FIG. 1B shows a high-level functional block diagram of an embodiment of a global navigation satellite system active antenna.

FIG. 1A shows a high-level functional block diagram of an embodiment of a system for receiving and processing global navigation satellite system (GNSS) signals. The system includes a GNSS active antenna 102 and a GNSS receiver 108. The GNSS active antenna 102 includes a GNSS antenna 104 and a broadband low-noise amplifier (LNA) unit 106. The broadband LNA unit 106 is positioned close to the GNSS antenna 104 to minimize signal loss between the GNSS antenna 104 and the broadband LNA unit 106. The broadband LNA unit 106 and the GNSS antenna 104 can be coupled, for example, by a short lead wire, a short microstrip line, or a short coax cable (for example, on the order of a few centimeters in length).

In many applications, the GNSS active antenna needs to be portable, and it is advantageous for the GNSS active antenna to have compact size and light weight. In surveying, for example, a GNSS active antenna is mounted on a survey pole that is carried around a site by an operator. Specific components, therefore, are selected to be compatible with compact size and light weight. In particular, low-loss, highly-selective filters can be implemented with cavity resonators; however, such filters are large and heavy and are not suitable for applications requiring compact size and light weight.

The GNSS active antenna 102 and the GNSS receiver 108 can be positioned further apart. The GNSS active antenna 102 and the GNSS receiver 108 can be coupled, for example, by a longer run of coax cable (for example, on the order of 1.5 to 100 meters or more in length). The broadband LNA unit 106 amplifies the signal outputted by the GNSS antenna 104 to compensate for the signal loss over the longer run of coax cable.

Signals 191 represent a set of GNSS signals transmitted by a constellation (set) of GNSS satellites 190 and received by the GNSS antenna 104; and signals 193 represent a set of interference signals transmitted by a set of interference sources 192 and received by the GNSS antenna 104. Signal 109 represents a radiofrequency (RF) signal outputted from the port 102A of the GNSS active antenna 102 and inputted into the port 108A of the GNSS receiver 108. Further details of the signals are provided below.

The direct-current (DC) supply power 113 represents a DC supply power outputted from the port 108A of the GNSS receiver 108 and inputted into the port 102A of the GNSS active antenna 102; the DC supply power 113 has the DC supply voltage 113V and the DC supply current 113I. To reduce the size and weight of the GNSS active antenna 102, DC supply power is fed to the GNSS active antenna 102 along the center conductor of the coax cable between the GNSS active antenna 102 and the GNSS receiver 108: a battery power supply on board the GNSS active antenna 102 is not used. Further details of the power feed are provided below.

A GNSS satellite is often referred to as a navigation satellite. Each navigation satellite in a global navigation satellite system can transmit radiofrequency (RF) signals on one or more operational frequency bands. The United States Global Positioning System (GPS), for example, has been allocated three operational frequency bands: L1 (1563-1588 MHz), L2 (1215-1240 MHz), and L5 (1164-1189 MHz). A single-band navigation receiver receives and processes signals on one operational frequency band (such as L1); a dual-band navigation receiver receives and processes signals on two operational frequency bands (such as L1 and L2); and a multi-band navigation receiver receives and processes signals on three or more operational frequency bands (such as L1, L2, and L5). A single-system navigation receiver receives and processes signals from a single GNSS (such as GPS); a dual-system navigation receiver receives and processes signals from two GNSSs (such as GPS and GLONASS); and a multi-system navigation receiver receives and processes signals from three or more GNSSs (such as GPS, GLONASS, and GALILEO). The operational frequency bands can be different for different systems. The full operational frequency range assigned to GNSSs is divided into two overall operational frequency bands: the low-frequency band (about 1164-1300 MHz) and the high-frequency band (about 1559-1610 MHz).

Other communications systems operate on frequencies close to the GNSS frequencies. Transmitters in these communications systems can be sources of interference signals that can degrade or disrupt GNSS measurements. For example, the Globalstar satellite communications system operates over 1610-1622 MHz (uplink) and 2483-2500 MHz (downlink), and the Inmarsat satellite communications system operates over 1626-1661 MHz (uplink) and 1525-1559 MHz (downlink). Other common sources of interference signals are cellular telephone communications systems; two commonly used frequency bands are the approximately 800-1000 MHz band and the approximately 1700-1900 MHz band. Long-Term Evolution (LTE) systems can operate over various channels with frequencies as low as 452 MHz and as high as 3600 MHz. Some LTE channels are close to the GNSS frequencies; for example, frequency-division-duplex (FDD) channel 11 operates over 1427.9-1452.9 MHz (uplink) and 1475.9-1500.9 MHz (downlink); FDD channel 21 operates over 1447.9-1462.9 MHz (uplink) and 1495.5-1510.9 MHz (downlink); and FDD channel 24 operates over 1625.5-1660.5 MHz (uplink) and 1525-1559 MHz (downlink).

Refer to FIG. 1B, which shows details of an embodiment of the GNSS active antenna 102. The GNSS active antenna 102 and the GNSS receiver 108 are configured to receive and process GNSS signals with frequencies in the range $f_{GL} \leq f_{GNSS} \leq f_{GH}$, where $f_{GNSS}$ refers to the frequency of a GNSS signal, $f_{GL}$ refers to the low-frequency limit, and $f_{GH}$ refers to the high-frequency limit. The low-frequency limit and the high-frequency limit are design values selected from the GNSS operating frequencies.

The signal 101 is outputted from the port 104A of the GNSS antenna 104 and inputted into the port 106A of the broadband LNA unit 106. The signal 101 represents the total sum of the received GNSS signals 191 and the interference signals 193. The broadband LNA unit 106 includes the following subsystems: a first filter stage F1 110, a first amplifier stage A1 112, a second filter stage F2 114, a second amplifier stage A2 116, a bias tee 118, and a low-dropout regulator (LDR) 120. In principle, a single stage of filtration followed by a single stage of amplification could be used. The filter would then need to be a low-loss filter with high selectivity. As discussed above, however, such a filter would be implemented with a cavity resonator, which would be too large and too heavy for applications requiring a compact, light-weight unit.

The port 106A of the broadband LNA unit 106 is connected to the port 110A of the first filter stage F1 110. The signal 101 is inputted into the port 110A of the first filter stage F1 110, which is an input broadband bandpass filter with low selectivity to reject signals with frequencies substantially separated from the GNSS frequencies. For example, for the low-frequency GNSS band (about 1164-1300 MHz), the 3-dB bandwidth of the first filter stage F1 110 ranges from about 1100 MHz to about 1350 MHz; for the high-frequency GNSS band (about 1559-1610 MHz), the 3-dB bandwidth of the first filter stage F1 110 ranges from about 1500 MHz to about 1640 MHz. The first filter stage F1 110 is configured to have a low loss in bandwidth and to have a low degradation in signal-to-noise ratio (SNR); for example, the insertion loss is about 0.5 dB for the passband. In an embodiment, the first filter stage F1 110 is configured to reject signals in major cellular telephone network frequency bands (for example, the approximately 800-1000 MHz band and the approximately 1700-1900 MHz band).

The signal 103 is outputted from the port 110B of the first filter stage F1 110 and inputted into the port 112A of the first amplifier stage A1 112, which is an input high-linear low-noise amplifier stage. The term "high-linear" is explained below. The first amplifier stage A1 112 is configured to have a low degradation in SNR and to reduce degradation of the noise figure caused by subsequent stages of filtration and amplification.

The signal 105 is outputted from the port 112B of the first amplifier stage A1 112 and inputted into the port 114A of the second filter stage F2 114, which is a broadband bandpass filter with steep frequency response slopes having high selectivity. Due to a large number of resonators, the second filter stage F2 114 has a relatively high loss; for example, the insertion loss for the passband is about 2.5 dB. The second filter stage F2 114 is configured to reject interference signals with frequencies adjacent to the GNSS frequency band. For example, for the low-frequency GNSS band (about 1164-1300 MHz), the 3-dB bandwidth of the second filter stage F2 114 ranges from about 1160 MHz to about 1300 MHz; for the high-frequency GNSS band (about 1559-1610 MHz), the 3-dB bandwidth of the second filter stage F2 114 ranges from about 1530 MHz to about 1620 MHz. The second filter stage F2 114 prevents the second amplifier stage A2 116 from being overloaded by interference signals amplified by the first amplifier stage A1 112.

The signal 107 is outputted from the port 114B of the second filter stage F2 114 and inputted into the port 116A of the second amplifier stage A2 116, which amplifies the signal 107. In an embodiment, the broadband LNA unit 106 is coupled to the GNSS receiver 108 by a coax cable. The second amplifier stage A2 116 amplifies the signal 107 to compensate for the signal loss in the coax cable and for the signal loss in the GNSS receiver 108.

The signal 109 is outputted from the port 116B of the second amplifier stage A2 116 and inputted into the port 118A of the bias tee 118, used as a DC decoupler. Bias tees are well-known in the art, and details are not described herein. For simplicity, the bias tee 118 is considered to be an ideal bias tee. The bias tee 118 passes RF signals from the port 118A to the port 118B without modification (loss or distortion); and the bias tee 118 passes DC signals from the port 118B to the port 118C without modification. The bias tee 118 blocks transmission of RF signals from the port 118A to the port 118C and blocks transmission of DC signals from the port 118B to the port 118A. The signal 109, representing the amplified RF signals, is outputted from the port 118B of the bias tee 118; the port 118B of the bias tee 118 is connected to the port 106B of the broadband LNA unit 106 and the port 102A of the GNSS active antenna 102. The signal 109 is transmitted over a coax cable and inputted into the port 108A of the GNSS receiver 108.

The LDR 120 supplies a highly-stabilized DC supply voltage $+V_{CC}$ 121 from the port 120A of the LDR 120 to the port 112C of the first amplifier stage A1 112 and a highly-stabilized DC supply voltage $+V_{CC}$ 123 from the port 120B of the LDR 120 to the port 116C of the second amplifier stage A2 116. As discussed above, input power to the broadband LNA unit 106 is supplied by a DC feed from the GNSS receiver 108 along the center conductor of the coax cable connecting the broadband LNA unit and the GNSS receiver. The DC supply power 113 has the DC supply voltage 113V and the DC supply current 113I. The DC supply voltage $+V_{C_1}$ 113V1 is outputted at the port 108A of the GNSS receiver 108. The DC supply voltage $+V_{C_2}$ 113V2 is received at the port 102A of the GNSS active antenna 102; the DC supply voltage $+V_{C_2}$ 113V2 is less than the DC supply voltage $+V_{C_1}$ 113V1 due to the voltage drop across the coax cable. The DC supply voltage $+V_{C_2}$ 113V2 is transmitted to the port 106B of the GNSS active antenna 102, then to the port 118B of the bias tee 118, then to the port 118C of the bias tee 118, and then to the input feed port 120C of the LDR 120.

Figure 1C:
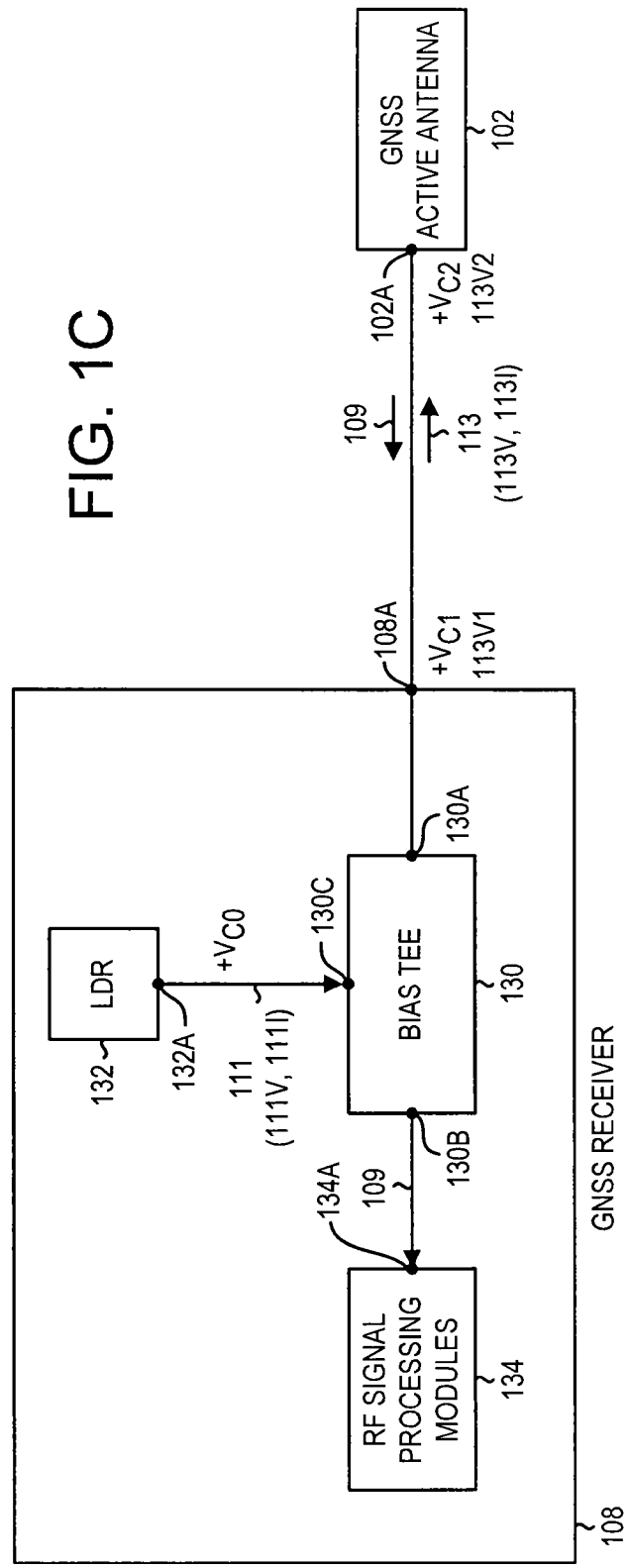
FIG. 1C shows a high-level functional block diagram of a first embodiment of a global navigation satellite system receiver.

Refer to FIG. 1C, which shows details of an embodiment of the GNSS receiver 108. The GNSS receiver 108 includes a bias tee 130, a low-dropout regulator (LDR) 132, and RF processing modules 134. The bias tee 130 is similar to the bias tee 118 described above, except that the bias tee 130 is used as a DC coupler. For simplicity, the bias tee 130 is considered to be an ideal bias tee. The bias tee 130 passes RF signals from the port 130A to the port 130B without modification; and the bias tee 130 passes DC signals from the port 130C to the port 130A without modification. The bias tee 130 blocks transmission of RF signals from the port 130A to the port 130C and blocks transmission of DC signals from the port 130C to the port 130B.

On the RF path, the GNSS receiver 108 receives the signal 109 from the GNSS active antenna 102 at the port 108A of the GNSS receiver 108. The port 108A of the GNSS receiver 108 is connected to the port 130A of the bias tee 130. The bias tee 130 passes the signal 109 from the port 130A to the port 130B. The signal 109 is then transmitted from the port 130B of the bias tee 130 to the port 134A of the RF signal processing modules 134.

On the DC path, the LDR 132 outputs the DC supply power 111 at the port 132A of the LDR 132; the DC supply power 111 has the DC supply voltage 111V and the DC supply current 111I. The LDR 132 is powered by a battery power supply (not shown). The DC supply power 111 is transmitted from the port 132A of the LDR 132 to the port 130C of the bias tee 130. The bias tee 130 passes the DC supply power 111 from the port 130C to the port 130A. The port 130A of the bias tee 130 is connected to the port 108A of the GNSS receiver 108. As described above, the DC supply power 113 is outputted from the port 108A of the GNSS receiver 108 over a coax cable and inputted into the port 102A of the GNSS active antenna 102. With an ideal bias tee, the voltage $+V_{C_1}$ 113V1 is equal to the voltage $+V_{C_0}$ 111V.

Now refer back to FIG. 1B. Under typical operating conditions, the signal level of the interference signals is typically much higher than the signal level of the GNSS signals. At the input port 112A of the first amplifier stage A1 112, for example, the signal level of the interference signals is on the order of −10 dBm (100 μW), the signal level of the thermal noise is on the order of −90 dBm, and the signal level of the GNSS signals is on the order of −130 dBm. The interference signals, the thermal noise, and the GNSS signals, are amplified by the first amplifier stage A1 112. The gain of the first amplifier stage A1 112 is a design value; a typical value, for example, is +17 dB. At the output port 112B of the first amplifier stage A1 112, the signal level of the interference signals is therefore typically on the order of +7 dBm (5 mW). As a result, the first amplifier stage A1 112 can be driven into the non-linear power-limiting mode. The power of the GNSS signals is then also power limited. If the signal levels of the GNSS signals are too low, GNSS measurements cannot be properly extracted from the GNSS signals.

The linearity range of an amplifier can be characterized by various parameters, such as the output 1-dB compression point (OIP1) and the output third-order intercept point (OIP3). Herein, an amplifier is referred to as a "high-linear" amplifier if its linearity range far exceeds the linear range required to handle the signals of interest (for example, the GNSS signals). The extended linearity range permits the amplifier to maintain operation in the linear mode when the signals of interest are accompanied by interference signals in which the signal levels of the interference signals far exceed the signal levels of the signals of interest. With the signal levels and the amplifier gain cited in the example above, a high-linear amplifier would have, for example, an OIP3 value of greater than 25 dBm (this OIP3 value would accommodate an interference input signal level as high as −5 dBm).

It is therefore advantageous to have early warning detection of excessively high interference signals; that is, the operator is warned that the signal level of the interference signals is approaching a threshold that will cause the first amplifier stage to transition from the high-linear mode to the non-linear mode. When the operator receives such early warning, he can take appropriate action such that the first amplifier stage does not enter the non-linear mode. Examples of appropriate actions include the following:

- If possible, the operator can switch off nearby transmission equipment that are sources of interference. This action is possible, of course, only if the operator has appropriate access to, and control of, the transmission equipment. Examples of such transmission equipment include cell phones and satellite communications terminals.
- If the operator cannot switch off the transmission equipment, and if the operator has the option of taking measurements at another location, the operator can move the active antenna to a location in which the signal level of the interference signals is acceptably low.
- If the operator cannot switch off the transmission equipment, and if the operator cannot relocate (for example, if the coordinates of a specific location need to be measured), the operator can postpone the measurement session until the signal level of the interference signals is acceptably low: often the operation of transmission equipment varies with day and time, and the signal level of interference signals can be strongly time dependent.
- The operator can manually or automatically record that a particular region has an excessively high signal level of interference signals. Data taken in that region can be flagged as suspect or invalid. Future attempts at GNSS measurements in that region can be avoided.
- The operator can deploy a larger and heavier active antenna that suppresses the interference signals more effectively; for example, an active antenna with a filter implemented with a cavity resonator.
- In some instances, the operator can decide that measuring site coordinates with GNSS is not viable and that a different geodetic method is warranted; for example, a total station used in conjunction with a prism mounted on a survey pole.

Figure 2:
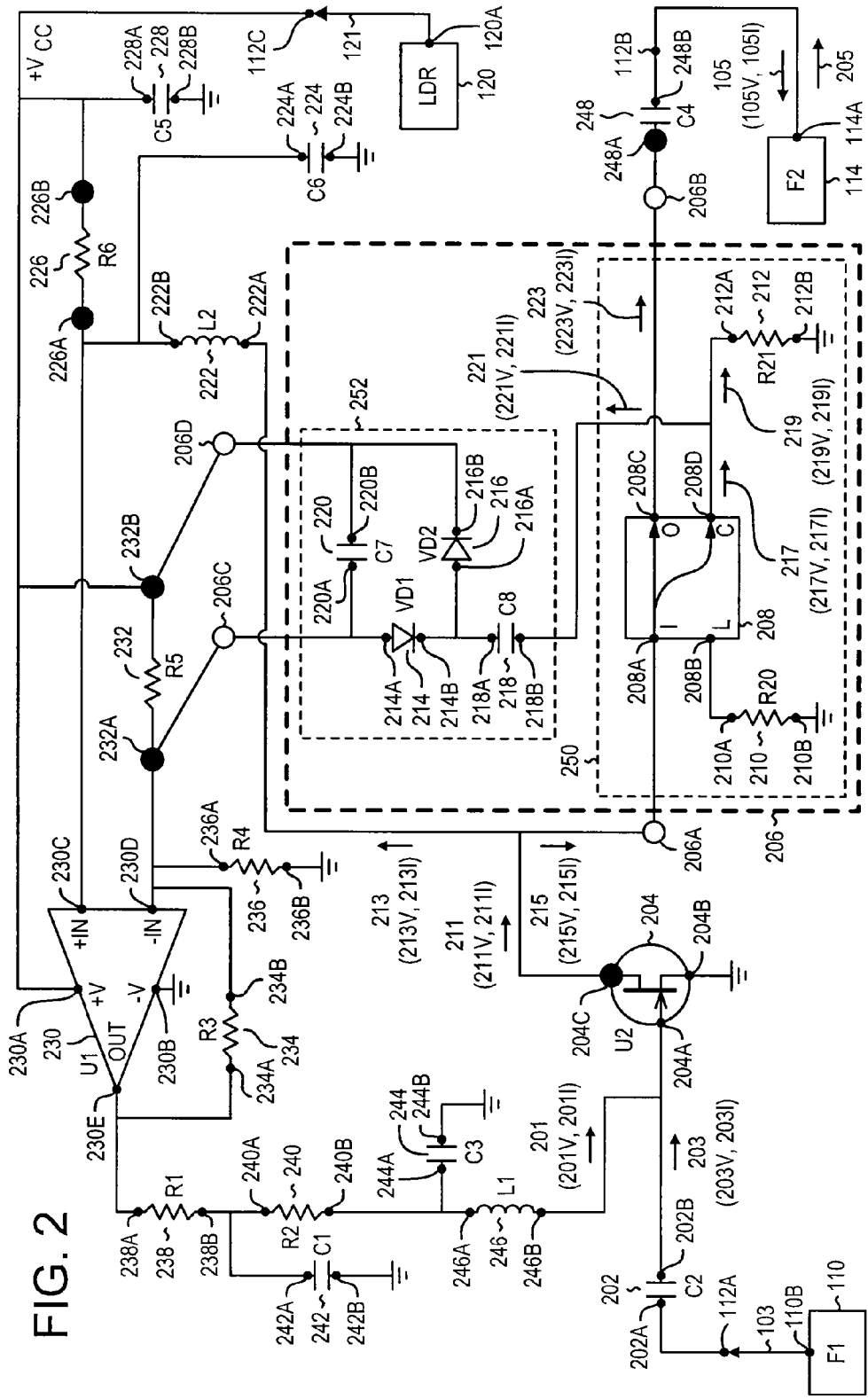
FIG. 2 shows a circuit diagram of an embodiment of a first amplifier stage, including an interference detector.

FIG. 2 shows a circuit diagram of an embodiment of the first amplifier stage A1 112. In FIG. 2 and subsequent circuit diagrams, all voltages are referenced to ground. The three major subsystems are the transistor U2 204, the operational amplifier U1 230, and the interference detector 206. Amplification of the signal 103 is performed by the transistor U2 204 with a DC and low-frequency negative feedback network based on the operational amplifier U1 230. The interference detector 206 detects an excessively high signal level of interference signals. An "excessively high signal level of interference signals" refers to a signal level of interference signals that exceeds a threshold value; the threshold value is a design value. The interference detector 206 is also incorporated into the DC and low-frequency negative feedback network and extends the linear range of the transistor U2 204. The range of low frequencies is described below.

The signal 103 is outputted from the port 110B of the first filter stage F1 110 (FIG. 1B) and inputted into the port 112A of the first amplifier stage A1 112. As discussed above, the signal 103 is a signal with signal components having frequencies within the passband of the first filter stage F1 110. The port 112A of the first amplifier stage A1 112 is connected to the terminal 202A of the (interstage) capacitor C2 202. The capacitor C2 202 blocks DC signals from being transmitted from the first amplifier stage A1 112 out the port 112A back to the first filter stage 110, removes DC and low-frequency signal components from the signal 103, and also is used for impedance matching. The terminal 202B of the capacitor C2 202 is connected to the terminal 204A of the transistor U2 204. Various devices, including bipolar junction transistors (BJTs) and field-effect transistors (FETs) can be used for the transistor U2 204. For example, a SiGe bipolar transistor or a Depletion-Mode High Electron Mobility Transistor (a type of FET) can be used. In an advantageous embodiment, the transistor U2 204 is an Enhancement-Mode High Electron Mobility Transistor (E-HEMT) (a type of FET). The transistor U2 204 has three terminals: for a FET, terminal 204A is the gate, terminal 204B is the source, and terminal 204C is the drain. The terminal 204B of the transistor U2 204 is connected to ground. The terminal 204C of the transistor U2 204 is connected to the terminal 206A of the interference detector 206, which is described in further detail below.

The terminal 204C of the transistor U2 204 is also connected to the terminal 222A of the inductor L2 222. The terminal 222B of the inductor L2 222 is connected to the terminal 224A of the (blocking) capacitor C6 224. The terminal 224B of the capacitor C6 224 is connected to ground. The terminal 222B of the inductor L2 222 is also connected to the terminal 226A of the (current probe) resistor R6 226. The terminal 226B of the resistor R6 226 is connected to the DC supply voltage +$V_{CC}$ 121, which is outputted from the port 120A of the LDR 120 (FIG. 1B) and inputted into the port 112C of the first amplifier stage A1 112. The terminal 226B of the resistor R6 226 is also connected to the terminal 228A of the (blocking) capacitor C5 228. The terminal 228B of the capacitor C5 228 is connected to ground.

Refer to the operational amplifier U1 230. The terminal 230A (positive supply voltage, +V) of the operational amplifier U1 230 is connected to the DC supply voltage +$V_{CC}$ 121. The terminal 230B (negative supply voltage, −V) of the operational amplifier U1 230 is connected to ground. The terminal 230C (non-inverting input, +IN) of the operational amplifier U1 230 is connected to the terminal 226A of the resistor R6 226, the terminal 224A of the capacitor C6 224, and the terminal 222B of the inductor L2 222. The terminal 230D (inverting input, −IN) of the operational amplifier U1 230 is connected to the terminal 234B of the (feedback) resistor R3 234. The terminal 234A of the resistor R3 234 is connected to the terminal 230E (output, OUT) of the operational amplifier U1 230.

The terminal 230D of the operational amplifier U1 230 is also connected to the terminal 236A of the (voltage divider) resistor R4 236. The terminal 236B of the resistor R4 236 is connected to ground. The terminal 230D of the operational amplifier U1 230 is also connected to the terminal 232A of the (voltage divider) resistor R5 232. The terminal 232B of the resistor R5 232 is connected to the DC supply voltage +$V_{CC}$ 121.

The terminal 230E of the operational amplifier U1 230 is also connected to the terminal 238A of the (loop filter) resistor R1 238. The terminal 238B of the resistor R1 238 is connected to the terminal 242A of the (loop filter) capacitor C1 242. The terminal 242B of the capacitor C1 242 is connected to ground. The terminal 238B of the resistor R1 238 is also connected to the terminal 240A of the (antiparasitic) resistor R2 240. The terminal 240B of the resistor R2 240 is connected to the terminal 244A of the (antiparasitic) capacitor C3 244. The terminal 244B of the capacitor C3 244 is connected to ground. The terminal 240B of the resistor R2 240 is also connected to the terminal 246A of the inductor L1 246. The terminal 246B of the inductor L1 246 is connected to the terminal 202B of the capacitor C2 202 and is also connected to the terminal 204A of the transistor U2 204.

The interference detector 206 includes a directional coupler circuit 250 and a rectifier circuit 252. The directional coupler circuit 250 includes a directional coupler 208, a (load) resistor R20 210, and a (matching) resistor R21 212. In the embodiment shown in FIG. 2, the rectifier circuit 252 is a voltage-doubler rectifier circuit that includes a rectifier diode VD1 214, a rectifier diode VD2 216, a (blocking) capacitor C7 220, and a (charging) capacitor C8 218. In an advantageous embodiment, the rectifier diode VD1 214 and the rectifier diode VD2 216 are Schottky rectifier diodes. The interference detector 206 has four terminals: the terminal 206A, the terminal 206B, the terminal 206C, and the terminal 206D.

A voltage-doubler rectifier circuit is advantageous because it provides higher sensitivity for detecting interference (see further discussion below). In another embodiment (not shown), the rectifier circuit is a single-rectifier circuit; for example, a single-rectifier circuit can be implemented if the rectifier diode VD2 216 in the rectifier circuit 252 is replaced with an inductor (choke).

Refer to the directional coupler 208, which has four terminals: the terminal 208A (incident or input, I), the terminal 208B (load, L), the terminal 208C (output, O), and the terminal 208D (coupled, C). In an embodiment, the coupling ratio of the directional coupler is 5 dB: for an incoming signal at the terminal 208A, the main portion of the incoming signal is directed to the terminal 208C; the tapped portion of the incoming signal is directed to the terminal 208D. For a 5 dB coupling ratio, the signal level at the terminal 208D is 5 dB less than the signal level at the terminal 208A, and the signal level at the terminal 208C is about 1.7 dB less than the signal level at the terminal 208A. In general, the coupling ratio is a design value. The value is selected as a compromise between providing a sufficiently large signal level at the terminal 208D (a larger signal level provides greater sensitivity for the interference detector 206)

and minimizing the signal loss at the terminal 208C (the signal at the terminal 208C is used for further processing of the GNSS signals).

The terminal 206A of the interference detector 206 is connected to the terminal 204C of the transistor U2 204, the terminal 222A of the inductor L2 222, and the terminal 208A of the directional coupler 208. The terminal 208C of the directional coupler 208 is connected to the terminal 206B of the interference detector 206. The terminal 206B of the interference detector 206 is also connected to the terminal 248A of the (interstage) capacitor C4 248. The terminal 248B of the capacitor 248 is connected to the port 112B of the first amplifier stage A1 112. The port 112B of the first amplifier stage A1 112 is connected to the port 114A of the second filter stage F2 114 (FIG. 1B).

The terminal 208B of the directional coupler 208 is connected to the terminal 210A of the resistor R20 210. The terminal 210B of the resistor R20 is connected to ground. The terminal 208D of the directional coupler 208 is connected to the terminal 212A of the resistor R21 212. The terminal 212B of the resistor R21 212 is connected to ground. The terminal 208D of the directional coupler 208 is also connected to the terminal 218B of the capacitor C8 218; the terminal 218B is the input terminal of the rectifier circuit 252.

The capacitor C7 220 is connected across the outputs (terminal 206C and terminal 206D) of the interference detector 206 in parallel with the resistor R5 232 (terminal 232A and terminal 232B). The terminal 206C and the terminal 206D are also the output terminals of the rectifier circuit 252. In an embodiment, the capacitor C7 220 and the capacitor C8 218 have the same capacitance value; however, the capacitance values can be different. The capacitance value is selected such that $X_C \ll R5$ (in practice, $X_C$ is $\leq \sim 0.01R5$), where $X_C$ is the reactance value of the capacitor, and R5 is the resistance value of the resistor R5 232; in an embodiment, C7=C8=100 pF, where C7 is the capacitance value of the capacitor C7 220 and C8 is the capacitance value of the capacitor C8 218, and R5=511 ohm.

A time constant of the interference detector 206 depends on the capacitance value of the capacitor C7 220 and the resistance value of the resistor R5 232. The time constant of the interference detector is given by $\tau_{ID}$=R5*C7; for the values of R5=511 ohm and C7=100 pF, $\tau_{ID}$ has a value of about 50 ns. In comparison, a time constant of the closed feedback loop (for regulating the operating current of the transistor U2 204) is substantially higher; it is determined primarily by a time constant $\tau_F$ of the loop filter formed by the resistor R1 238 and the capacitor C1 242. The time constant $\tau_F$ is given by $\tau_F$=R1*C1, where R1 is the resistance value of the resistor R1 238, and C1 is the capacitance value of the capacitor C1 242; in an embodiment, $T_F$ has a value of 50 μs. The cutoff frequency value of the loop filter is given by $f_F$=1/(2π$\tau_F$); for $\tau_F$=50 μs, $f_F$=3.2 kHz.

The closed DC and low-frequency negative feedback loop therefore processes only low-frequency fluctuations of the detected interference amplitude envelope in addition to its detected DC signal component. An interference signal can be considered as a narrow-band signal with a random amplitude and phase. In some instances, the interference signal (for example, LTE signal) is not a sinusoidal carrier wave and has characteristics similar to noise. Rectification of such a signal differs slightly from the rectification of a sinusoidal wave, because its amplitude envelope varies in accordance with a Rayleigh distribution and includes many signal components having different frequencies. Only the DC and low-frequency signal components (resulting from changes in the operating parameters of the transistor as a function of time and temperature) are useful, and high-frequency components are filtered out (using C7 and the loop filter of R1 and C1). An interference signal amplified by a high-linear amplification stage has sufficient strength for such signal processing.

The directional coupler 208 provides small variations of the detector transfer coefficient in a broad frequency band by separating [at the terminal 208D (coupled, C) and at the terminal 208B (load, L)] incident and reflected waves at the output of the first amplifier stage A1 112. The signal 105 (with the signal voltage 105V and the signal current 105I) is transmitted from the port 112B of the first amplifier stage A1 112 to the port 114A of the second filter stage F2 114 (FIG. 1B). A portion of the signal 105 is reflected at the port 114A of the second filter stage F2 114 and transmitted back to the port 112B of the first amplifier stage A1 112. The reflected signal is referenced as the signal 205.

Figure 6A:
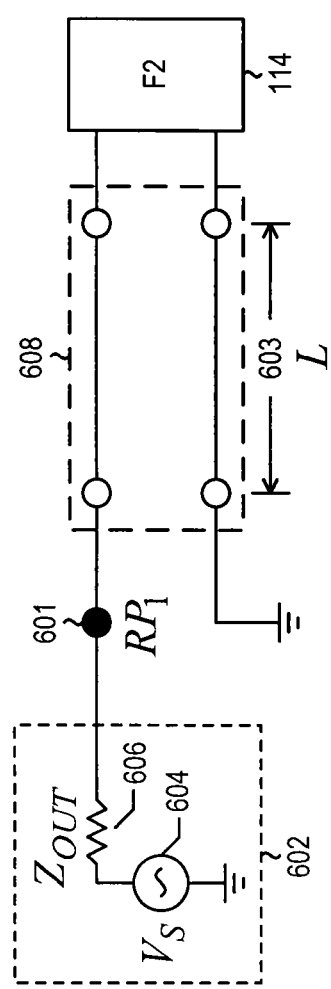
FIG. 6A shows an equivalent circuit diagram of an embodiment of a first amplifier stage without a directional coupler.
Figure 6B:
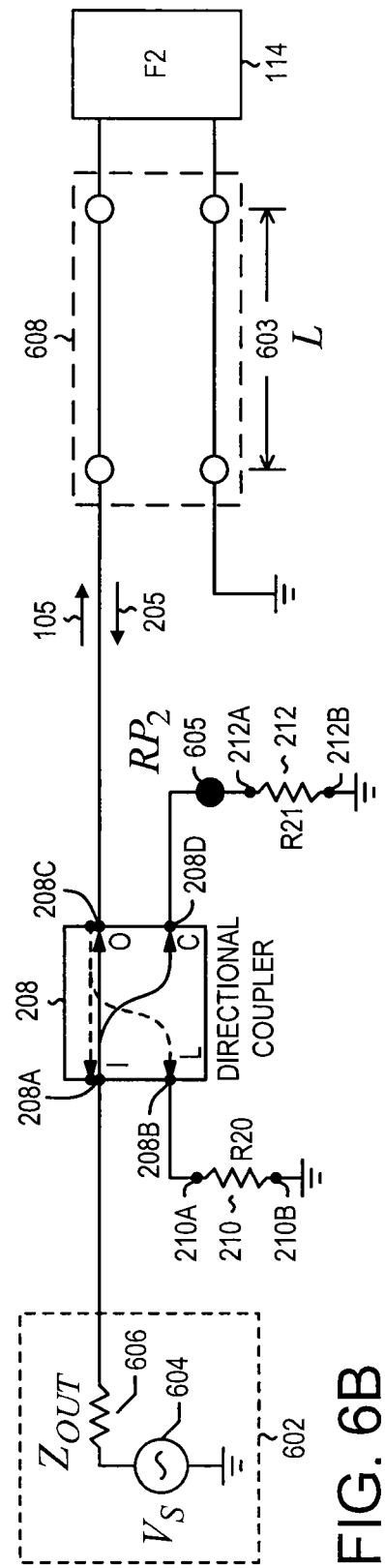
FIG. 6B shows an equivalent circuit diagram of an embodiment of a first amplifier stage with a directional coupler.

The function of the directional coupler is illustrated by the equivalent circuit diagrams in FIG. 6A and FIG. 6B and the signal amplitude plots in FIG. 5A and FIG. 5B.

First refer to FIG. 6A. The output circuitry of the first amplifier stage A1 (without a directional coupler) is represented by the equivalent circuit 602, which includes a signal source $V_S$ 604 with an output characteristic impedance $Z_{OUT}$ 606 (typically 50Ω). The equivalent circuit 602 is connected by a transmission line 608 (for example, a coax cable or a microstrip line) to the input of the second filter stage F2 114. The length of the transmission line 608 is L 603; the value can vary and is a design value. The reference point $RP_1$ 601 indicates the signal point where the rectifier circuit for the interference detector would be connected, in the absence of a directional coupler.

Refer to FIG. 5A. The horizontal axis 501 represents the signal frequency f; and the vertical axis 503 represents the signal voltage U. The plot 502 is an illustrative example for a specific value of the length of the transmission line and for a specific second filter stage F2. The plot 502 shows the signal voltage $U_{NDC}$(f) at the signal point $RP_1$ 601 as a function of the signal frequency f. The frequency $f_{2L}$ 511 represents the low cutoff frequency of the second filter stage F2 114; and the frequency $f_{2H}$ 513 represents the high cutoff frequency of the second filter stage F2 114. The frequency $f_{1L}$ 515 ($f_{1L} < f_{2L}$) represents the low-frequency limit of the signal inputted into the second filter stage F2 114 (the frequency $f_{1L}$ 515 corresponds to the low cutoff frequency of the first filter stage F1 110); and the frequency $f_{1H}$ 517 ($f_{1H} > f_{2H}$) represents the high-frequency limit of the signal inputted into the second filter stage F2 114 (the frequency $f_{1H}$ 517 corresponds to the high cutoff frequency of the first filter stage F1 110). Incoming signals with frequencies $f_{1L} \leq f \leq f_{1H}$ pass through the first filter stage F1 110 with low suppression, are amplified by the first amplifier stage A1 112, and are transmitted to the second filter stage F2 114. Signals with frequencies outside the passband ($f_{2L} \leq f \leq f_{2H}$) of the second filter stage F2 114 are reflected back to the first amplifier stage A1 112. Interference of the incident and reflected signals can cause erratic variations of the signal voltage at $RP_1$. For example, consider a frequency $f_L$ 505, where $f_{1L} \leq f_L \leq f_{2L}$, and a frequency $f_H$ 507, where $f_{1H} > f_H > f_{2H}$. As shown in FIG. 5A, $U_{NDC}(f=f_L)=U_2$ 521, $U_{NDC}(f_{2L} \leq f \leq f_{2H})=U_1$ 519, and $U_{NDC}(f=f_H)=U_3$ 523.

Now refer to FIG. 6B, in which the directional coupler 208 is inserted between the equivalent circuit 602 and the transmission line 608. The reference point $RP_2$ 605 indicates the signal point where the rectifier circuit for the interference detector would be connected, in the presence of the directional coupler. Refer to FIG. 5B. The plot 504 is an illustrative example for the specific value of the length of the transmission line and for the specific second filter stage F2 used for the plot 502 above. The plot 504 shows the signal voltage $U_{DC}$(f) at the signal point $RP_2$ 605 as a function of the signal frequency f. The signal voltage $U_{DC}$ (f) is flat across the full frequency range of the signal ($f_{1L} \leq f \leq f_{1H}$) transmitted from the first amplifier stage A1 112 to the second filter stage F2 114. As shown in FIG. 5B, $U_{DC}$ (f)=$U_4$ 525, where $U_4$ is 5 dB down from $U_1$.

Refer again to FIG. 6B. The reflected signal 205 is inputted into the port 208C of the directional coupler 208. In the reverse direction, the main portion of the reflected signal is directed to the port 208A; the main portion of the reflected signal is then dissipated in the output impedance $Z_{OUT}$. The tapped portion of the reflected signal (−5 dB of the reflected signal) is directed to the terminal 208B; the tapped portion of the reflected signal is then dissipated in the resistor R20 210.

A directional coupler typically has ports with 50-Ω characteristic impedance. The resistance value R20 of the resistor R20 210 is 50 Ω to match the characteristic impedance of the port. The resistance value R21 of the resistor R21 212 is typically 75-100Ω. At the terminal 208D, the resistor R21 is connected in parallel with the input impedance of the rectifier circuit 252. The input impedance of the rectifier circuit 252 varies non-linearly with the signal level of the interference signal, and the resistance value R21 is selected to maintain the load at the terminal 208D close to 50Ω.

Return to FIG. 2. The terminal 204A (gate) of the transistor U2 204 receives two control signals: the signal 203 (with the signal voltage 203V and the signal current 203I) and the signal 201 (with the signal voltage 201V and the signal current 201I). The signal 203 is transmitted from the terminal 202B of the capacitor 202: the signal 203 is the signal 103 after the signal 103 has passed through the capacitor C2 202; therefore, the signal 203 includes only high-frequency signal components. The signal 201 is transmitted from the terminal 246B of the inductor L1 246. As discussed below, the signal 201 includes only DC and low-frequency signal components. The signal 201 serves as a negative feedback signal to stabilize the DC and low-frequency signal components of the output signal of the transistor (see discussion below). Herein, the range of low-frequency signal components is a design value; that is, a low-frequency signal component has a frequency below a specified frequency value (limit). In FIG. 2, the range of low-frequency signal components is set by the cutoff frequency of the loop filter formed by the resistor R1 238 and the capacitor C1 242 (in the example above, the cutoff frequency was 3.2 kHz). Low-frequency signal components arise from temperature changes, instabilities in the electrical and electronic components (in particular, the transistor), and rectification of certain interference signals (such as LTE, as discussed above).

The signal 211 (with the signal voltage 211V and the signal current 211I) at the terminal 204C (drain) of the transistor U2 204 is controlled by the voltage at the terminal 204A (gate) of the transistor 204. The signal 211 is referred to as the drain signal; the signal voltage 211V is referred to as the drain voltage; and the signal current 211I is referred to as the drain current. The signal 211, the signal voltage 211V, and the signal current 211I have high-frequency signal components, a DC signal component, and low-frequency signal components.

The signal 211 is divided into the signal 213 (with the signal voltage 213V and the signal current 213I) and the signal 215 (with the signal voltage 215V and the signal current 215I). Here, both the signal voltage 213V and the signal voltage 215V are equal to the drain voltage 211V; both the signal voltage 213V and the signal voltage 215V include high-frequency signal component voltages, a DC signal component voltage, and low-frequency signal component voltages. The drain current 211I is the sum of the signal current 213I and the signal current 215I, where the signal current 215I is much less than the signal current 213I. The signal current 213I, referred to herein as the operating current (or work current) $I_O$, includes only DC and low-frequency signal component currents because it flows through the inductor (choke) L2 222, which has a large reactance for the high-frequency signal component currents. The signal current 215I includes only high-frequency signal current components; the signal current 215I is subsequently divided into the signal current 223I and the signal current 217I; the capacitor C4 248 blocks DC and low-frequency signal component currents from the signal current 223I, and the directional coupler 208 blocks DC and low-frequency signal current components from the signal current 217I.

The signal 215 is inputted into the terminal 206A of the interference detector 206. The terminal 206A of the interference detector 206 is connected to the terminal 208A of the directional coupler 208A. The main portion of the incoming signal at the terminal 208A of the directional coupler 208 is directed to the terminal 208C of the directional coupler 208. The terminal 208C of the directional coupler 208 is connected to the terminal 206B of the interference detector 206. The terminal 206B of the interference detector 206 is connected to the terminal 248A of the capacitor C4. The signal 223 (with the signal voltage 223V and the signal current 223I) is transmitted from the terminal 206B of the interference detector 206 to the terminal 248A of the capacitor 248. The terminal 248B of the capacitor 248 is connected to the port 112B of the first amplifier stage A1 112. The signal 105 (with the signal voltage 105V and the signal current 105I) is transmitted from the port 112B of the first amplifier stage A1 112 to the port 114A of the second filter stage F2 114.

The tapped portion of the incoming signal at the terminal 208A of the directional coupler 208 is directed to the terminal 208D of the directional coupler 208. The output signal 217 (with the signal voltage 217V and the signal current 217I) from the terminal 208D of the directional coupler 208 is divided into the signal 219 (with the signal voltage 219V and the signal current 219I) and the signal 221 (with the signal voltage 221V and the signal current 221I). The signal 219 is inputted into the terminal 212A of the resistor R21 212; the terminal 212B of the resistor R21 212 is connected to ground.

The signal 221 is inputted into the rectifier circuit 252 at the terminal 218B of the capacitor C8. As discussed above, in the embodiment shown, the rectifier circuit 252 is a voltage-doubler rectifier circuit. The rectifier circuit 252 generates a direct-current (DC) voltage that is twice the peak amplitude of the incoming alternating-current (AC) voltage. Higher sensitivity and a smoother detector signal are thus obtained.

The output voltage of the rectifier circuit 252 appears across the terminal 206C and the terminal 206D of the rectifier circuit 252. The terminal 206C and the terminal 206D of the rectifier circuit 252 are connected to the terminal 232A and the terminal 232B of the resistor R5 232, respectively. Therefore, the output voltage of the rectifier circuit 252 appears as a voltage across the terminals of the resistor R5 232. The resistance value R5 of the resistor R5

232 is <<the resistance value R4 of the resistor R4 236. In practice, R5≤~0.1R4; in one example, R5 is about 511Ω, and R4 is about 12 kΩ for +$V_{CC}$=+2.7 V.

The terminal 218A of the capacitor C8 is connected to the terminal 214B (cathode) of the rectifier diode VD1 214 and is also connected to the terminal 216A (anode) of the rectifier diode VD2 216. The terminal 214A (anode) of the rectifier diode VD1 214 is connected to the terminal 220A of the capacitor C7 220 and also to the terminal 206C of the interference detector 206. The terminal 216B (cathode) of the rectifier diode VD2 216 is connected to the terminal 220B of the capacitor C7 and also to the terminal 206D of the interference detector 206.

Figure 7A:
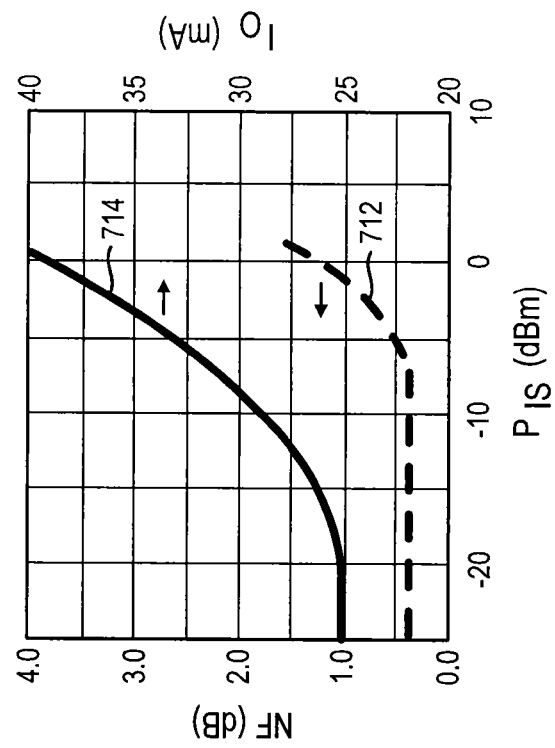
FIG. 7A shows plots of noise figure and operating current as a function of input interference signal power for an embodiment of a first amplifier stage without an interference detector.
Figure 7B:
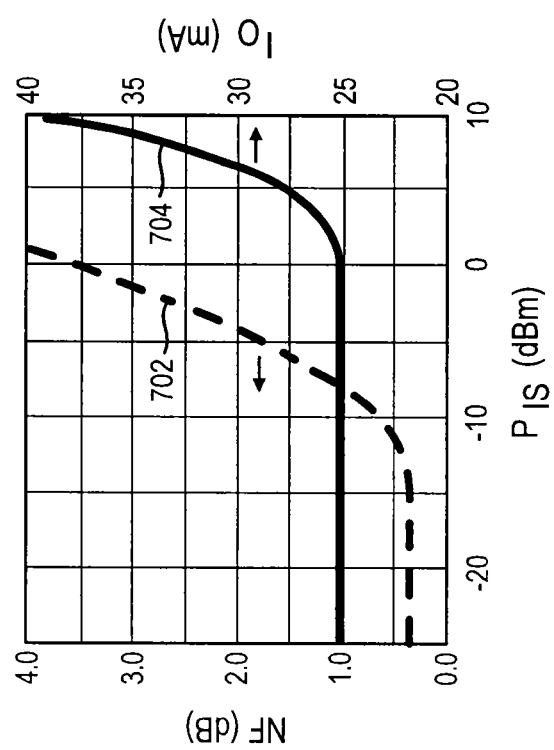
FIG. 7B shows plots of noise figure and operating current as a function of input interference signal power for an embodiment of a first amplifier stage with an interference detector.

The benefits of the interference detector 206 is shown in FIG. 7A and FIG. 7B. FIG. 7A show plots of the noise figure and the operating current as a function of the input interference signal level for a first amplifier stage A1 without the interference detector 206. To more clearly distinguish changes in the noise figure value, the first filter stage F1 110 (FIG. 1B) has been removed from the input signal path. Plot 702 is a plot of the noise figure NF at 1575 MHz (in units of dB) as a function of the input interference power $P_{IS}$ at 1495 MHz (in units of dBm). The noise figure NF stays constant at 0.3 dB up to an input interference power $P_{IS}$ critical value of −15 dBm and then increases rapidly. Plot 704 is a plot of the operating current $I_O$ (in units of mA) as a function of the input interference power $P_{IS}$ at 1495 MHz (in units of dBm). As discussed above, the operating current $I_O$ is the signal current 213I from the drain terminal 204C of the transistor U2 204 (FIG. 2). The operating current $I_O$ stays constant at 25 mA up to an input interference power $P_{IS}$ critical value of 0 dBm and then increases rapidly.

FIG. 7B show plots of the noise figure and the operating current as a function of the input interference signal level for a first amplifier stage A1 with the interference detector 206. To more clearly distinguish changes in the noise figure value, the first filter stage F1 110 (FIG. 1B) has been removed from the input signal path. Plot 712 is a plot of the noise figure NF at 1575 MHz (in units of dB) as a function of the input interference power $P_{IS}$ at 1495 MHz (in units of dBm). The noise figure NF stays constant at 0.3 dB up to an input interference power $P_{IS}$ threshold value of −7 dBm and then increases rapidly. Plot 714 is a plot of the operating current $I_O$ (in units of mA) as a function of the input interference power $P_{IS}$ at 1495 MHz (in units of dBm). The operating current $I_O$ stays constant at 25 mA up to an input interference power $P_{IS}$ threshold value of −20 dBm and then increases rapidly. The threshold values are set by the coupling ratio of the directional coupler 208, the resistance value R5 of the resistor R5 232 and the resistance value R6 of the resistor R6 226, and the capacitance value C8 of the capacitor C8 218 (FIG. 2).

In summary, the operating current 213I of the transistor U2 204 is stabilized using DC and low-frequency negative feedback. A portion of the drain current 211I, referred to as the signal current 215I, has high-frequency signal components and is proportional to the signal level of the signal 203, which is applied to the gate (terminal 204A) of the transistor U2 204; as discussed above, the signal level of the signal 203 is predominately that of interference signals. A portion of the drain current 211I, referred to as the operating current ($I_O$) 213I, has DC and low-frequency signal components and flows through the resistor R6 226; the voltage at the terminal 226A of the resistor R6 226 is proportional to the operating current 213I. The voltage at the terminal 226A of the resistor R6 226 is compared with a reference voltage at the terminal 232A of the resistor R5 232; the reference voltage is generated by the voltage divider comprising the resistor R4 236 and the resistor R5 232. The differential signal is amplified by the operational amplifier U1 230, and the amplified signal is filtered by the loop filter comprising the resistor R1 238 and the capacitor C1 242. The filtered signal is applied to the gate (terminal 204A) of the transistor 204, thereby closing the DC and low-frequency negative feedback loop.

A portion of the signal voltage 215V, referred to as the signal voltage 221V, is outputted from the terminal 208D of the directional coupler 208 and inputted into the rectifier circuit 252. At sufficiently low levels of the signal voltage 221V, there is no detected voltage across the output terminals (terminal 206C and terminal 206D) of the rectifier circuit 252, because the rectifier diode VD1 214 and the rectifier diode VD2 216 are closed by the negative voltage at the terminal 232A of the resistor R5 232 (threshold voltage). The process of rectifying does not begin until the interference signal level is sufficient for the voltage to exceed the threshold voltage. Then current begins to flow through the resistor R5 232, the rectifier diode VD1 214, and the rectifier diode VD2 216; consequently, the voltage at the terminal 232A of the resistor 232 becomes less positive. The feedback loop reacts immediately by increasing the operating current 213I of the transistor 204, thereby making the voltage of the terminal 226A of the resistor R6 226 less positive too and equal to the new value of voltage at the terminal 232A of the resistor 232.

Thus, at sufficiently high levels of interference signals, the interference detector increases the operating current and the linearity of the first amplifier stage A1 without worsening its noise figure. Ultimately, however, the maximum value of the operating current is limited by the maximum DC supply current (typically, on the order of 100-150 mA) transmitted to the GNSS active antenna by the GNSS receiver (FIG. 10). Furthermore, portable GNSS receivers are battery powered, and extended high values of operating current decrease the run time of the GNSS receiver. Therefore, when high levels of interference signals are present, it is advantageous for the operator to be alerted such that he can take appropriate action, as described above.

Figure 3C:
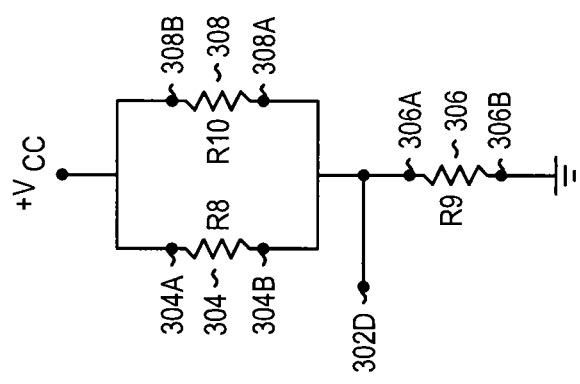

FIG. 3A shows a circuit diagram of an embodiment of a signal-level indicator unit, referred to as the interference indicator unit 300, which is integrated with the broadband LNA unit 106. The interference indicator unit 300 has two input terminals: the terminal 300A and the terminal 300B. The terminal 300A of the interference indicator unit 300 is connected to the terminal 226A of the resistor R6 226 (FIG. 2), and the terminal 300B of the interference indicator unit 300 is connected to the terminal 226B of the resistor R6 226.

Refer to the operational amplifier U3 302, which is configured as a comparator. The terminal 302A (positive supply voltage, +V) of the operational amplifier U3 302 is connected to the DC supply voltage +$V_{CC}$ 121 via the terminal 300B of the interference indicator 300. The terminal 302B (negative supply voltage, −V) of the operational amplifier U3 302 is connected to ground. The terminal 302C (inverting input, −IN) of the operational amplifier U3 302 is connected to the terminal 300A of the interference indicator 300. The terminal 302D (non-inverting input, +IN) of the operational amplifier U3 302 is connected to the terminal 304B of the (feedback or hysteresis) resistor R8 304. The terminal 304A of the resistor R8 304 is connected to the terminal 302E (output, OUT) of the operational amplifier U3 302. The resistor R8 304 determines the hysteresis (insensitivity zone) of the comparator, as described below.

The terminal 302D of the operational amplifier U3 302 is also connected to the terminal 306A of the (comparator threshold) resistor R9 306. The terminal 306B of the resistor R9 306 is connected to ground. The terminal 302D of the operational amplifier U3 302 is also connected to the terminal 308A of the (comparator threshold) resistor R10 308. The terminal 308B of the resistor R10 308 is connected to the terminal 300B of the interference indicator 300. The resistor R9 306 and the resistor R10 308 form a voltage divider.

The terminal 302E of the operational amplifier U3 302 is also connected to the terminal 310A of the (current-limiting) resistor R7 310. The terminal 310B of the resistor R7 is connected to the terminal 312A (anode) of the light-emitting diode (LED) VD3 312. The terminal 312B (cathode) of the LED VD3 312 is connected to ground. The LED is an embodiment of a signal-level indicator.

The voltage drop across the terminal 226A and the terminal 226B of the resistor 226 is a function of the operating current 213I (FIG. 2). At sufficiently low levels of the operating current (less than or equal to a threshold value), the voltage at the terminal 302C of the operational amplifier U3 302 is higher than the voltage at the terminal 302D of the operational amplifier U3 302, and the voltage at the output terminal 302E of the operational amplifier U3 302 is zero: the LED VD3 312 is turned off. (All voltages are measured with respect to ground.) At sufficiently high levels of the operating current (greater than the threshold value), the voltage at the terminal 302C of the operational amplifier U3 302 is less than the voltage at the terminal 302D of the operational amplifier U3 302, and the voltage at the output terminal 302E of the operational amplifier U3 302 is $+V_{CC}$: the LED VD3 312 is turned on. The threshold value is a design value; for example, it can be selected such that it corresponds to an (approximately) 30%-increase in operating current compared to the nominal value. The nominal value of the operating current corresponds to the value of the operating current at low values of input interference power; in the examples previously shown in FIG. 7A and FIG. 7B, the nominal value of the operating current would be 25 mA.

When the operating current is sufficiently high such that the analyzed voltage $V_{-IN}$ at the terminal 302C is close to the comparator threshold voltage $V_{+IN}$ at the terminal 302D, in the absence of the (feedback or hysteresis) resistor R8 304, noise in $V_{-IN}$ can cause $V_{-IN}$ to repeatedly fall below and rise above $V_{+IN}$; consequently, the LED will blink on and off. To reduce the effects of noise, hysteresis is provided by the resistor R8 304, as described below.

Figure 3B:
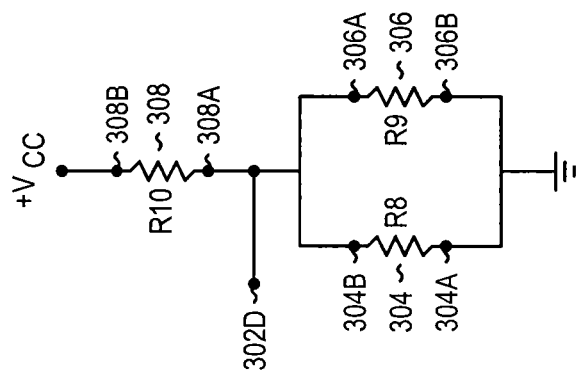

Assume that $V_{-IN}$ is greater than $V_{+IN}$. The output voltage at the terminal 302E of the operational amplifier U3 302 is then 0; therefore, the voltage at the terminal 304A of the resistor R8 304 is 0 (ground voltage level). The resistor R10 308, the resistor R9 306, and the resistor R8 304 are then configured in the equivalent circuit shown in FIG. 3B. The comparator threshold voltage $V_{+IN1}$ at the terminal 302D is given by:

$$V_{+IN1} = V_{CC}\left(\frac{R8R9}{R8R9 + R8R10 + R9R10}\right),$$

where R8 is the resistance value of the resistor R8 304, R9 is the resistance value of the resistor R9 306, and R10 is the resistance value of the resistor R10 308.

Now assume that $V_{-IN}$ is less than $V_{+IN}$. The output voltage at the terminal 302E of the operational amplifier U3 302 is then $+V_{CC}$; therefore, the voltage at the terminal 304A of the resistor R8 304A is $+V_{CC}$. The resistor R10 308, the resistor R9 306, and the resistor R8 304 are then configured in the equivalent circuit shown in FIG. 3C. The comparator threshold voltage $V_{+IN2}$ at the terminal 302D is given by:

$$V_{+IN2} = V_{CC}\left(\frac{(R8 + R10)R9}{R8R9 + R8R10 + R9R10}\right)$$

$$= V_{+IN1}\left(1 + \frac{R10}{R8}\right).$$

Therefore, $V_{+IN2}$ is greater than $V_{+IN1}$.

Assume that the comparator is initially in the off state ($V_{-IN} < V_{+IN1}$). Once the comparator switches from the off state to the on state ($V_{-IN} < V_{+IN1}$), the comparator threshold voltage simultaneously increases from $V_{+IN1}$ to $V_{+IN2}$. For the comparator to subsequently switch from the on state to the off state, the voltage $V_{-IN}$ then needs to be greater than the new higher comparator threshold voltage $V_{+IN2}$, not the initial lower comparator threshold voltage $V_{+IN1}$.

Similarly, assume that the comparator is initially in the on state ($V_{-IN} < V_{+IN2}$). Once the comparator switches from the on state to the off state ($V_{-IN} > V_{+IN2}$), the comparator threshold voltage simultaneously decreases from $V_{+IN2}$ to $V_{+IN1}$. For the comparator to subsequently switch from the off state to the on state, the voltage $V_{-IN}$ then needs to be less than the new lower comparator threshold voltage $V_{+IN1}$, not the initial higher comparator threshold voltage $V_{+IN2}$.

The broadband LNA unit 106 is typically enclosed by a shield to reduce electrical and electromagnetic interference. To maintain the integrity of the shield, while maximizing the visibility of the LED, a small opening can be produced in the shield. An optical fiber is inserted through the opening. One end of the optical fiber is coupled to the LED; the other end of the optical fiber is coupled to a lens on the external housing of the broadband LNA unit. An LED is advantageous as an indicator since it draws low current and generates only optical signals (that is, the LED is not itself a source of high frequency interference signals). When the operator sees the lit LED, he can take appropriate action, as described above.

An embodiment of a signal-level indicator unit (in particular, an interference indicator unit) is integrated with a GNSS receiver. FIG. 4A shows a high-level functional block diagram of an embodiment of a GNSS receiver, referenced as the GNSS receiver 418. The GNSS receiver 418 is similar to the GNSS receiver 108 (FIG. 1C), except that the GNSS receiver 418 includes an embodiment of a signal-level indicator unit, referred to as the interference indicator unit 422, connected between the LDR 132 and the bias tee 130. The port 418A of the GNSS receiver 418 is coupled to the port 102A of the GNSS active antenna 102 with, for example, a coax cable. The GNSS active antenna 102 transmits the signal 109 to the GNSS receiver 418; and the GNSS receiver 418 transmits the DC supply power 413 to the GNSS active antenna 102.

The DC supply power 413 include the DC supply voltage 413V and the DC supply current 413I. At the port 418A of the GNSS receiver 418, the DC supply voltage is $+V_{C1}$ 413V1. At the port 102A of the GNSS active antenna 102, the DC supply voltage is $+V_{C2}$ 413V2. The voltage $+V_{C2}$ is less than the voltage $+V_{C1}$ due to the voltage drop across the coax cable. The details of the GNSS active antenna 102 are the same as those shown in FIG. 1B, except the input DC supply voltage is $+V_{C2}$ 413V2 instead of $+V_{C2}$ 113V2.

The interference indicator unit 422 includes an embodiment of a signal-level indicator control circuit, referred to as the interference indicator control circuit 400, and an embodiment of a signal-level indicator, referred to as the interference indicator 420. Since the interference indicator 420 is not integrated with the broadband LNA unit 106, there are more flexible options for the interference indicator 420. The interference indicator 420 can still be a lit LED; however, for example, it can also be an audio alarm transmitted by a beeper, an audio warning message transmitted by a speaker, a visual alarm (such as a flashing red icon) displayed on a display, or a visual warning message displayed on a display.

Figure 4B:
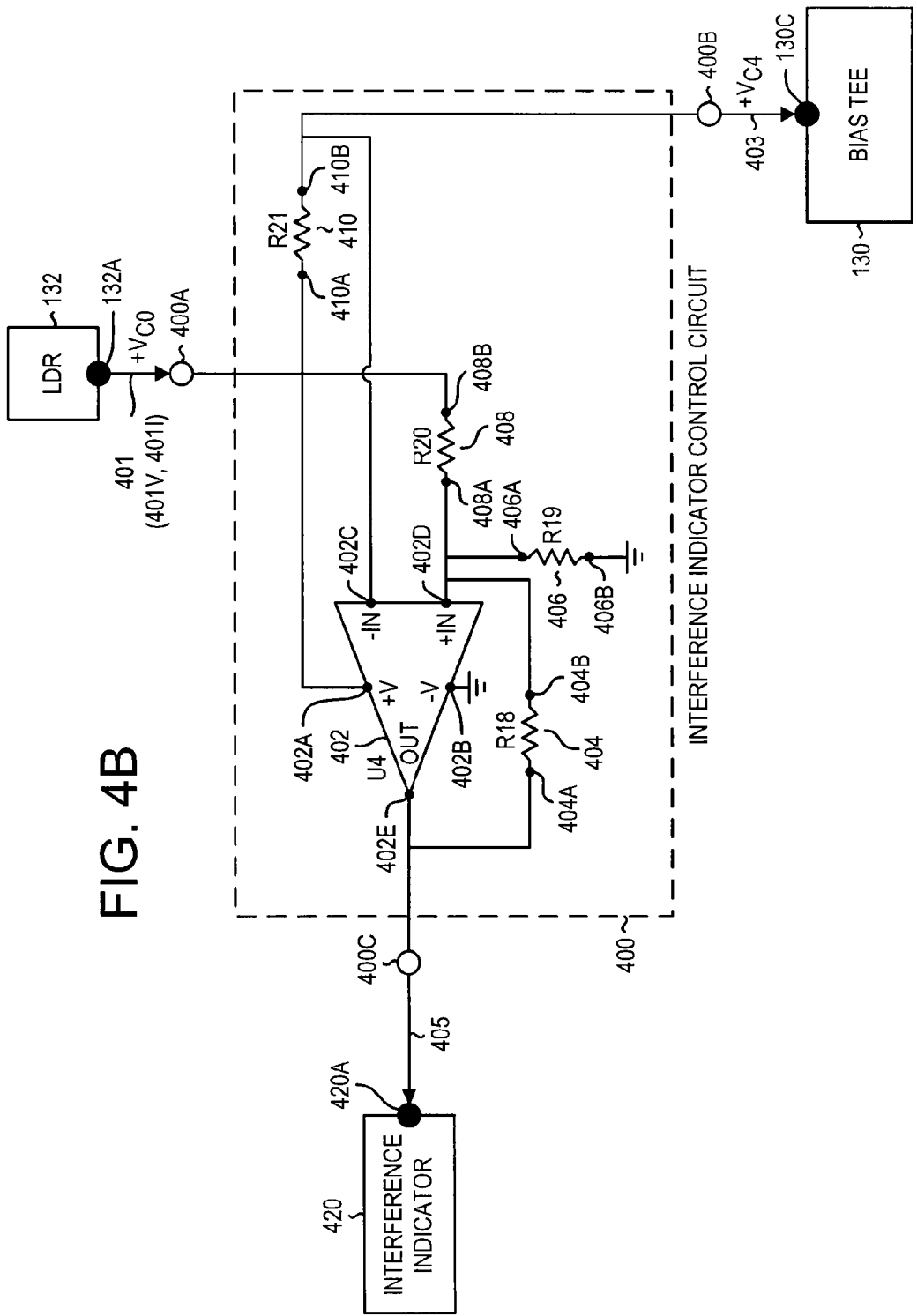
FIG. 4B shows a circuit diagram of an embodiment of an interference indicator control circuit.

FIG. 4B shows a circuit diagram of an embodiment of the interference indicator control circuit 400. The interference indicator control circuit 400 has three terminals: the terminal 400A, the terminal 400B, and the terminal 400C. The terminal 400A of the interference detector 400 is fed with the DC supply power 401, which is outputted from the port 132A of the low-dropout regulator (LDR) 132. The DC supply power 401 includes the DC supply voltage 401V and the DC supply current 401I. At the port 132A of the LDR 132, the DC supply voltage 401V is $+V_{C0}$. The LDR 132 supplies the DC power for the GNSS active antenna 102. The GNSS receiver includes one or more additional DC power supplies (not shown) for supplying DC power to components in the receiver; a battery (not shown) is the ultimate source of DC power that feeds the DC power supplies. Under typical operating conditions, however, the major load on the LDR 132 is the transistor U2 204 (FIG. 2) in the first amplifier stage A1 112 of the broadband LNA unit 106, and $I_C = I_O$, where $I_C$ is the DC supply current 401I and $I_O$ is (as described above) the operating current 213I from the drain terminal 204C of the transistor U2 204. In the first amplifier stage A1 112, the load from the operational amplifier U1 230 and the load from the passive components are significantly less than the operating current 213I. Similarly, the load from the second amplifier stage A2 116 in the broadband LNA unit 106 is significantly less than the operating current 213I; also, the load from the second amplifier stage A2 116 is well stabilized (that is, the current drawn by the second amplifier stage A2 116 is nearly constant). In particular, variations in the DC supply current 401I are primarily due to variations in the operating current 213I; therefore, variations in the DC supply current 401I closely track variations in the operating current 213I.

Refer to the operational amplifier U4 402, which is configured as a comparator. The terminal 402A (positive supply voltage, +V) of the operational amplifier U4 402 is connected to the DC supply voltage $+V_{C0}$ 401V via the terminal 400A of the interference indicator control circuit 400. The terminal 402B (negative supply voltage, −V) of the operational amplifier U4 402 is connected to ground. The terminal 402C (inverting input, −IN) of the operational amplifier U4 402 is connected to the terminal 410B of the (current probe) resistor R21 410. The resistance value R21 of the resistor R21 410 is a design value; it is on the order of a few ohms. The terminal 410B of the resistor R21 410 is also connected to the terminal 400B of the interference indicator control circuit 400. The terminal 410A of the resistor R21 410 is connected to the DC supply voltage $+V_{C0}$ 401V.

The terminal 402D (non-inverting input, +IN) of the operational amplifier U4 402 is connected to the terminal 404B of the (feedback or hysteresis) resistor R18 404. The resistor R18 404 serves the same function as that of the resistor R8 304 previously described in reference to FIG. 3. The terminal 404A of the resistor R18 404 is connected to the terminal 402E (output, OUT) of the operational amplifier U4 402. The terminal 402D of the operational amplifier U4 402 is also connected to the terminal 406A of the (comparator threshold) resistor R19 406. The terminal 406B of the resistor R19 406 is connected to ground. The terminal 402D of the operational amplifier U4 402 is also connected to the terminal 408A of the resistor R20 408. The terminal 408B of the resistor R20 408 is connected to the DC supply voltage $+V_{C0}$ 401V. The resistor R19 406 and the resistor R20 408 form a voltage divider.

The voltage drop across the resistor R21 410 is proportional to the current flowing through it; the current is approximately the DC supply current $I_C$ (the current drawn by the operational amplifier U4 402 and the passive components in the interference indicator control circuit 400 are negligible). As discussed above, variations in the DC supply current $I_C$ closely track variations in $I_O$, the operating current 213I. At sufficiently low values of the DC supply current $I_C$, the voltage at the terminal 402O is higher than the comparator threshold voltage (voltage at terminal 402D), and the voltage at the output terminal 402E is zero. At a sufficiently high value of the DC supply current $I_C$, the voltage at the terminal 402C becomes less than the comparator threshold voltage (voltage at terminal 402D), and the voltage at the output terminal 402E is $+V_{C0}$.

The output terminal 402E of the operational amplifier 402 is connected to the terminal 400C of the interference indicator control circuit 400. The output signal 405 outputted from the terminal 400C of the interference indicator control circuit 400 to the input terminal 420A of the interference indicator 420 is a high/low voltage signal. The interference indicator 420 includes the appropriate interface circuitry to convert the high/low voltage signal to an audio or visual indicator. The terminal 410B of the resistor R21 410 is also connected to the output terminal 400B of the interference indicator control circuit 400. The signal 403 is the DC supply power 403 outputted to the terminal 130C of the bias tee 130. The voltage $+V_{C4}$ at the terminal 400B of the interference indicator control circuit 400 is slightly less than the voltage $+V_{C0}$ at the terminal 132A of the LDR 132 due to the voltage drop across the resistor R21 410.

The first amplifier stage A1 112 can be used (a) with the interference indicator unit 300 alone, (b) with the interference indicator unit 422 alone, or (c) with both the interference indicator unit 300 and the interference indicator unit 422.

The embodiment of the first amplifier stage A1 112 shown in FIG. 2 was described in particular with respect to GNSS applications. In general, embodiments of the first amplifier stage can be used for other signal processing applications. In general, the first amplifier stage receives input signals with frequencies in the range of $f_{1L} \leq f_{INPUT} \leq f_{1H}$, where $f_{INPUT}$ is an input signal frequency, $f_{1L}$ is the input signal low-frequency limit, and $f_{1H}$ is the input signal high-frequency limit. For example, $f_{1L}$ can be the low cutoff frequency and $f_{1H}$ can be the high cutoff frequency of an input bandpass filter coupled to the input of the first amplifier stage. The first amplifier stage can be used for input signal frequencies in the radiofrequency and microwave ranges (in particular, it is advantageous for input signal frequencies from about 100 MHz to about 5 GHz).

In an application of interest, the input signals include process signals and interference signals. Process signals refer to wanted signals (also referred to as desired signals and signals of interest) that are to be processed for an application. Interference signals refer to unwanted signals (also referred to as undesired signals and signals not of interest). The process signals have frequencies in the range $f_{2L} \leq f_{PROCESS} \leq f_{2H}$, where $f_{PROCESS}$ is a process signal frequency, $f_{2L}$ is the process signal low-frequency limit, and $f_{2H}$ is the process signal high-frequency limit. Here, $f_{1L} < f_{2L} \leq f_{PROCESS} \leq f_{2H} < f_{1H}$.

The interference signals have frequencies in the ranges $f_{1L} \leq f_{INT} < f_{2L}$ and $f_{2H} < f_{INT} \leq f_{1H}$, where $f_{INT}$ is an interference signal frequency. The input signals (process signals and interference signals) are all amplified by the amplifier stage. The amplified output signals are transmitted to an output bandpass filter coupled to the output of the first amplifier stage. The output bandpass filter has a low cutoff frequency $f_{2L}$ and a high cutoff frequency $f_{2H}$. The output bandpass filter passes the amplified process signals with frequencies $f_{2L} \leq f_{PROCESS} \leq f_{2H}$ and rejects the amplified interference signals with frequencies $f_{1L} \leq f_{INT} < f_{2L}$ and $f_{2H} < f_{INT} \leq f_{1H}$. The rejected amplified interference signals are reflected back to the amplifier stage. The amplified process signals are transmitted to a second amplifier stage coupled to the output of the output bandpass filter. The further amplified process signals are then transmitted to a receiver for final processing.

The low cutoff frequency $f_{1L}$ and the high cutoff frequency $f_{1H}$ of the input bandpass filter are selected such that $f_{1L}$ is sufficiently far from $f_{2L}$ and $f_{1H}$ is sufficiently far from $f_{2H}$ such that the input bandpass filter does not need to be a low-loss bandpass filter with steep band edges (a low-loss bandpass filter with steep band edges would be implemented with cavity resonators, which are large and heavy and are not suited for applications requiring compact size and light weight). At the same time, the low cutoff frequency $f_{1L}$ and the high cutoff frequency $f_{1H}$ of the input bandpass filter are selected such that $f_{1L}$ is sufficiently close to $f_{2L}$ and $f_{1H}$ is sufficiently close to $f_{2H}$ such that the first amplifier stage is not overloaded with interference signals under most operating conditions.

In general, the primary amplifier element in the first amplifier stage is a transistor. The transistor can be a field effect transistor (FET) or a bipolar junction transistor (BJT) (a bipolar junction transistor is also referred to as a bipolar transistor). Specific designs of transistors are selected based on the specific input signal frequencies. A transistor has an input terminal, an output terminal, and a control terminal. For an FET, the input terminal corresponds to the source terminal, the output terminal corresponds to the drain terminal, and the control terminal corresponds to the gate terminal. For a BJT, the input terminal corresponds to the emitter terminal, the output terminal corresponds to the collector terminal, and the control terminal corresponds to the base terminal.

The output signal (having an output signal voltage and an output signal current) from the output terminal is controlled by the control signal applied to the control terminal. The control signal applied to the control terminal is the sum of the input high-frequency signals and a negative feedback signal with DC and low-frequency signal components. The output signal is divided into two portions. The first portion of the output signal includes the DC and low-frequency signal components; the current of the first portion of the output signal is referred to herein as the operating current. The second portion of the output signal includes the high-frequency signal components.

Operation of the transistor is characterized by operational parameters such as gain, frequency response, and other parameters described by the S-parameter matrix. Stable values of these operational parameters as a function of time and environmental conditions (such as temperature) is desired. For an FET, these operational parameters are dependent on the operating current $I_O$ and the drain voltage $V_D$. The drain voltage is a function of the supply voltage and the operating current. Since a low-dropout regulator is used for the supply voltage, the supply voltage is constant. Therefore, variations in the drain voltage are due to variations in the operating current. Consequently, a stable operating current results in a stable drain voltage and stable operational parameters of the transistor. Similar considerations apply for a BJT.

The operating current is stabilized by a DC and low-frequency negative feedback circuit. To detect high levels of the input high-frequency signals, a portion of the high-frequency signal components of the output signal is inputted into a rectifier circuit. At sufficiently low levels of the input high-frequency signals, the input voltage to the rectifier circuit does not exceed a specified voltage threshold value, and the rectifier circuit does not output a rectified signal. The feedback circuit maintains the operating current at a constant value as a function of time and environmental conditions.

When the input voltage to the rectifier circuit exceeds the specified voltage threshold value, the rectifier circuit outputs a rectified signal whose voltage is dependent on the input voltage. The output voltage of the rectifier circuit includes a DC component and, in the general case, low-frequency components (the frequency distribution of the output voltage depends on the characteristics of the input high-frequency signals). The signal levels of the low-frequency components are small in comparison to the DC component (typically, the signal levels of the low-frequency components are several percent of the DC component). The output voltage of the rectifier circuit is inputted into the DC and low-frequency negative feedback circuit such that the operating current is increased and the linearity range of the first amplifier stage is increased. The rectified signal provides positive feedback for low-frequency components, but the feedback circuit stays stable because only the envelope of the high-frequency signals is detected. A voltage-doubler rectifier circuit provides increased sensitivity for detecting high levels of the input high-frequency signals.

In an embodiment, a signal-level indicator provides an indication when the operating current exceeds a specified operating-current threshold value. The indication alerts an operator that the operating current is excessively high; however, the specified operating-current threshold value is selected to be sufficiently low such that the first amplifier stage has not entered the non-linear mode. In applications in which the operating current is dependent on the signal level of the interference signals, the indication alerts the operator that the signal level of the interference signals is excessively high.

In an embodiment, the first amplifier stage is fed with DC power from a DC power supply in a receiver. Variations in the DC supply current are substantially based on variations in the operating current. Therefore, when the operating current exceeds the specified operating-current threshold value, the DC supply current exceeds a corresponding specified DC-supply-current threshold value. A signal-level indicator provides an indication when the DC supply current exceeds the specified DC-supply-current threshold value (and, hence, when the operating current exceeds the specified operating-current threshold value). In applications in which the operating current is dependent on the signal level of the interference signals, the indication alerts the operator that the signal level of interference signals is excessively high.

An embodiment of the first amplifier stage described above can be used for each channel of a dual-channel (two channels) or multi-channel (three or more channels) low-noise amplifier. Each channel processes input signals in a different frequency band. In one embodiment, each channel has a separate signal-level indicator. In another embodiment, the channels share a common signal-level indicator: the common signal-level indicator provides an indication when the signal level in at least one channel is excessively high.

The foregoing Detailed Description is to be understood as being in every respect illustrative and exemplary, but not restrictive, and the scope of the invention disclosed herein is not to be determined from the Detailed Description, but rather from the claims as interpreted according to the full breadth permitted by the patent laws. It is to be understood that the embodiments shown and described herein are only illustrative of the principles of the present invention and that various modifications may be implemented by those skilled in the art without departing from the scope and spirit of the invention. Those skilled in the art could implement various other feature combinations without departing from the scope and spirit of the invention.

The invention claimed is:

1. A high-linear amplifier stage configured to receive a first plurality of signals from a first bandpass filter, amplify the first plurality of signals to generate a second plurality of signals, transmit the second plurality of signals to a second bandpass filter, and receive a third plurality of signals reflected back from the second bandpass filter, wherein the first bandpass filter has a first low cutoff frequency and a first high cutoff frequency, the second bandpass filter has a second low cutoff frequency and a second high cutoff frequency, the second low cutoff frequency is greater than the first low cutoff frequency, and the second high cutoff frequency is less than the first high cutoff frequency, the high-linear amplifier stage comprising:
   a high-linear transistor comprising:
      a transistor output terminal; and
      a transistor control terminal;
   an operational amplifier comprising:
      an operational-amplifier inverting terminal;
      an operational-amplifier non-inverting terminal; and
      an operational-amplifier output terminal;
   a rectifier circuit comprising:
      a rectifier-circuit input terminal;
      a rectifier-circuit first output terminal; and
      a rectifier-circuit second output terminal;
   a directional coupler comprising:
      a directional-coupler incident terminal;
      a directional-coupler output terminal;
      a directional-coupler coupled terminal; and
      a directional-coupler load terminal;
   a load resistor comprising a load-resistor first terminal and a load-resistor second terminal, wherein:
      the load-resistor first terminal is connected to the directional-coupler load terminal; and
      the load-resistor second terminal is connected to electrical ground; and
   a matching resistor comprising a matching-resistor first terminal and a matching-resistor second terminal, wherein:
      the matching-resistor first terminal is connected to the directional-coupler coupled terminal; and
      the matching-resistor second terminal is connected to electrical ground;
   wherein, in response to receiving a plurality of control signals at the transistor control terminal, wherein the plurality of control signals is based at least in part on the first plurality of signals, and wherein the plurality of control signals comprises a direct-current control signal, a plurality of low-frequency control signals, and a plurality of high-frequency control signals:
      the high-linear transistor transmits a plurality of transistor output signals from the transistor output terminal, wherein the plurality of transistor output signals comprises:
         a direct-current transistor output signal voltage;
         a direct-current transistor output signal current;
         a plurality of low-frequency transistor output signal voltages;
         a plurality of low-frequency transistor output signal currents;
         a plurality of high-frequency transistor output signal voltages; and
         a plurality of high-frequency transistor output signal currents;
      the directional-coupler incident terminal receives a directional-coupler incident signal comprising the plurality of high-frequency transistor output signal voltages and the plurality of high-frequency transistor output signal currents;
      the directional-coupler output terminal receives a directional-coupler output signal comprising a first portion of the directional-coupler incident signal, wherein the second plurality of signals is based at least in part on the directional-coupler output signal;
      the directional-coupler coupled terminal receives a directional-coupler coupled signal comprising a second portion of the directional-coupler incident signal;
      the rectifier-circuit input terminal receives, from the directional-coupler coupled terminal, a rectifier-circuit input voltage based at least in part on the plurality of high-frequency transistor output signal voltages, wherein, when the rectifier-circuit input voltage exceeds a specified rectifier-circuit threshold voltage, the rectifier circuit outputs a rectifier-circuit output voltage across the rectifier-circuit first output terminal and the rectifier-circuit second output terminal, wherein the rectifier-circuit output voltage is based at least in part on the rectifier-circuit input voltage;
      the operational-amplifier non-inverting terminal receives an operational-amplifier non-inverting-terminal voltage based at least in part on an operating current comprising a sum of the direct-current transistor output signal current and the plurality of low-frequency transistor output signal currents;
      the operational-amplifier inverting terminal receives an operational-amplifier inverting-terminal voltage based at least in part on an operational-amplifier inverting-terminal reference voltage and based at least in part on the rectifier-circuit output voltage; and
      the operational-amplifier output terminal outputs an operational-amplifier output signal based at least in part on a difference between the operational-amplifier non-inverting-terminal voltage and the operational-amplifier inverting-terminal voltage, wherein the direct-current transistor control signal and the plurality of low-frequency transistor control signals are based at least in part on the operational-amplifier output signal.

2. The high-linear amplifier stage of claim 1, wherein the high-linear transistor is an enhancement-mode high electron mobility transistor.

3. The high-linear amplifier stage of claim 1, wherein the rectifier circuit comprises a voltage-doubler rectifier circuit.

4. The high-linear amplifier stage of claim 3, wherein the voltage-doubler rectifier circuit comprises:

a first rectifier diode comprising a first-rectifier-diode anode and a first-rectifier-diode cathode;
a second rectifier diode comprising a second-rectifier-diode anode and a second-rectifier-diode cathode;
a first capacitor comprising a first-capacitor first terminal and a first-capacitor second terminal; and
a second capacitor comprising a second-capacitor first terminal and a second-capacitor second terminal;
wherein:
the first-rectifier-diode cathode is connected to the second-rectifier-diode anode;
the first-capacitor first terminal is the rectifier-circuit input terminal;
the first-capacitor second terminal is connected to the first-rectifier-diode cathode and the second-rectifier-diode anode;
the second-capacitor first terminal is connected to the first-rectifier-diode anode;
the second-capacitor second terminal is connected to the second-rectifier-diode cathode;
the second-capacitor first terminal is the rectifier-circuit first output terminal; and
the second-capacitor second terminal is the rectifier-circuit second output terminal.

5. The high-linear amplifier stage of claim 4, wherein:
the first rectifier diode is a first Schottky rectifier diode; and
the second rectifier diode is a second Schottky rectifier diode.

6. The high-linear amplifier stage of claim 1, wherein the operational amplifier is a first operational amplifier, further comprising a signal-level indicator unit comprising:
a second operational amplifier configured as a comparator, wherein the second operational amplifier comprises:
a second-operational-amplifier inverting terminal;
a second-operational-amplifier non-inverting terminal; and
a second-operational-amplifier output terminal;
a feedback resistor comprising a feedback-resistor first terminal and a feedback-resistor second terminal;
a current-limiting resistor comprising a current-limiting-resistor first terminal and a current-limiting-resistor second terminal; and
a light-emitting diode comprising a light-emitting-diode anode and a light-emitting-diode cathode;
wherein:
the feedback-resistor first terminal is connected to the second-operational-amplifier output terminal;
the feedback-resistor second terminal is connected to the second-operational-amplifier non-inverting terminal;
the current-limiting-resistor first terminal is connected to the second-operational-amplifier output terminal;
the current-limiting-resistor second terminal is connected to the light-emitting-diode anode; and
the light-emitting-diode cathode is connected to electrical ground; and
wherein:
in response to:
the second-operational-amplifier non-inverting terminal receiving a second-operational-amplifier non-inverting terminal reference voltage; and
the second-operational-amplifier inverting terminal receiving a second-operational-amplifier inverting terminal voltage based at least in part on the operating current, wherein the second-operational-amplifier inverting terminal voltage exceeds the second-operational-amplifier non-inverting terminal reference voltage:
the second-operational-amplifier output terminal outputs a second-operational-amplifier output terminal current through the light-emitting diode, and the light-emitting diode emits light.

7. The high-linear amplifier stage of claim 6, wherein the second-operational-amplifier non-inverting terminal reference voltage is set such that the light-emitting diode emits light before the high-linear amplifier stage enters a non-linear mode.

8. The high-linear amplifier stage of claim 6, wherein:
the first plurality of signals comprises a plurality of process signals and a plurality of interference signals;
the operating current is based at least in part on the plurality of interference signals; and
the light-emitting diode emits light in response to a signal level of the plurality of interference signals exceeding a specified interference-signal-level threshold value.

9. The high-linear amplifier stage of claim 8, wherein the plurality of process signals comprises a plurality of global navigation satellite signals.

10. The high-linear amplifier stage of claim 1, wherein:
the operational amplifier is a first operational amplifier;
the high-linear amplifier stage is a portion of a low-noise amplifier;
the low-noise amplifier is coupled to a receiver by a coax cable;
the low-noise amplifier is configured to receive direct-current power from the receiver via the coax cable; and
the receiver comprises:
a direct-current power supply having a direct-current-power-supply output terminal; and
a second operational amplifier configured as a comparator, wherein the second operational amplifier comprises:
a second-operational-amplifier inverting terminal;
a second-operational-amplifier non-inverting terminal; and
a second-operational-amplifier output terminal;
a feedback resistor comprising a feedback-resistor first terminal and a feedback-resistor second terminal, wherein:
the feedback-resistor first terminal is connected to the second-operational-amplifier output terminal; and
the feedback-resistor second terminal is connected to the second-operational-amplifier non-inverting terminal; and
a signal-level indicator connected to the second-operational-amplifier output terminal;
wherein:
in response to:
the direct-current power supply transmitting a supply current from the direct-current-power-supply output terminal to the low-noise amplifier, wherein variations in the supply current are substantially based on variations in the operating current;
the second-operational-amplifier non-inverting terminal receiving a second-operational-amplifier non-inverting terminal reference voltage; and
the second-operational-amplifier inverting terminal receiving a second-operational-amplifier inverting terminal voltage based at least in part on the supply current, wherein the second-operationalamplifier inverting terminal voltage exceeds the second-operational-amplifier non-inverting terminal reference voltage:
the second-operational-amplifier output terminal outputs a second-operational-amplifier output signal to the signal-level indicator, and the signal-level indicator outputs an indicator signal that indicates that the supply current exceeds a specified supply-current threshold value.

11. The high-linear amplifier stage of claim 10, wherein the signal-level indicator comprises:
a light-emitting diode;
an audible alarm; or
a visual display.

12. The high-linear amplifier stage of claim 10, wherein:
the first plurality of signals comprises a plurality of process signals and a plurality of interference signals;
the operating current is based at least in part on the plurality of interference signals; and
the signal-level indicator outputs the indicator signal in response to a signal level of the plurality of interference signals exceeding a specified interference-signal-level threshold value.

13. The high-linear amplifier stage of claim 12, wherein the plurality of process signals comprises a plurality of global navigation satellite signals.

14. The high-linear amplifier stage of claim 1, wherein:
in response to the high-linear amplifier stage receiving the third plurality of signals reflected back from the second bandpass filter:
the third plurality of signals is transmitted to the directional-coupler output terminal;
a first portion of the third plurality of signals is transmitted from the directional-coupler output terminal to the directional-coupler incident terminal; and
a second portion of the third plurality of signals is transmitted from the directional-coupler output terminal to the directional-coupler load terminal.

15. The high-linear amplifier stage of claim 1, wherein the first plurality of signals comprises:
a plurality of process signals; and
a plurality of interference signals.

16. The high-linear amplifier stage of claim 15, wherein the plurality of process signals comprises a plurality of global navigation satellite signals.

17. The high-linear amplifier stage of claim 1, wherein:
the first low cutoff frequency is 1100 MHz;
the first high cutoff frequency is 1350 MHz;
the second low cutoff frequency is 1160 MHz; and
the second high cutoff frequency is 1300 MHz.

18. The high-linear amplifier stage of claim 1, wherein:
the first low cutoff frequency is 1500 MHz;
the first high cutoff frequency is 1640 MHz;
the second low off frequency is 1530 MHz; and
the second high cutoff frequency is 1620 MHz.

19. A method for signal processing, the method comprising the steps of:
receiving a first plurality of signals from a first bandpass filter, wherein the first bandpass filter has a first low cutoff frequency and a first high cutoff frequency;
generating a plurality of control signals, wherein the plurality of control signals is based at least in part on the first plurality of signals, and wherein the plurality of control signals comprises:
a direct-current control signal;
a plurality of low-frequency control signals; and
a plurality of high-frequency control signals;
in response to receiving the plurality of control signals at a transistor control terminal of a high-linear transistor, generating, at a transistor output terminal of the high-linear transistor, a plurality of transistor output signals, wherein the plurality of transistor output signals comprises:
a direct-current transistor output signal voltage;
a direct-current transistor output signal current;
a plurality of low-frequency transistor output signal voltages;
a plurality of low-frequency transistor output signal currents;
a plurality of high-frequency transistor output signal voltages; and
a plurality of high-frequency transistor output signal currents;
receiving, at a directional-coupler incident terminal of a directional coupler, a directional-coupler incident signal comprising the plurality of high-frequency transistor output signal voltages and the plurality of high-frequency transistor output signal currents;
receiving, at a directional-coupler output terminal of the directional coupler, a directional-coupler output signal comprising a first portion of the directional-coupler incident signal;
receiving, at a directional-coupler coupled terminal of the directional coupler, a directional-coupler coupled signal comprising a second portion of the directional-coupler incident signal;
receiving, at a rectifier-circuit input terminal of a rectifier circuit, a rectifier-circuit input voltage based at least in part on the directional-coupler coupled signal, wherein, when the rectifier-circuit input voltage exceeds a specified rectifier-circuit threshold voltage, the rectifier circuit outputs a rectifier-circuit output voltage across a rectifier-circuit first output terminal of the rectifier circuit and a rectifier-circuit second output terminal of the rectifier circuit, wherein the rectifier-circuit output voltage is based at least in part on the rectifier-circuit input voltage;
receiving, at an operational-amplifier non-inverting terminal of an operational amplifier, an operational-amplifier non-inverting-terminal voltage based at least in part on an operating current comprising a sum of the direct-current transistor output signal current and the plurality of low-frequency transistor output signal currents;
receiving, at an operational-amplifier inverting terminal of the operational amplifier, an operational-amplifier inverting-terminal voltage based at least in part on an operational-amplifier inverting-terminal reference voltage and based at least in part on the rectifier-circuit output voltage; and
generating, at an operational-amplifier output terminal of the operational amplifier, an operational-amplifier output signal based at least in part on a difference between the operational-amplifier non-inverting-terminal voltage and the operational-amplifier inverting-terminal voltage, wherein the direct-current transistor control signal and the plurality of low-frequency transistor control signals are based at least in part on the operational-amplifier output signal.

20. The method of claim 19, wherein the high-linear transistor is an enhancement-mode high electron mobility transistor.

21. The method of claim 19, wherein the rectifier circuit comprises a voltage-doubler rectifier circuit.

22. The method of claim 21, wherein the voltage-doubler rectifier circuit comprises:
a first rectifier diode comprising a first-rectifier-diode anode and a first-rectifier-diode cathode;
a second rectifier diode comprising a second-rectifier-diode anode and a second-rectifier-diode cathode;
a first capacitor comprising a first-capacitor first terminal and a first-capacitor second terminal; and
a second capacitor comprising a second-capacitor first terminal and a second-capacitor second terminal;
wherein:
the first-rectifier-diode cathode is connected to the second-rectifier-diode anode;
the first-capacitor first terminal is the rectifier-circuit input terminal;
the first-capacitor second terminal is connected to the first-rectifier-diode cathode and the second-rectifier-diode anode;
the second-capacitor first terminal is connected to the first-rectifier-diode anode;
the second-capacitor second terminal is connected to the second-rectifier-diode cathode;
the second-capacitor first terminal is the rectifier-circuit first output terminal; and
the second-capacitor second terminal is the rectifier-circuit second output terminal.

23. The method of claim 22, wherein:
the first rectifier diode is a first Schottky rectifier diode; and
the second rectifier diode is a second Schottky rectifier diode.

24. The method of claim 19, wherein the operational amplifier is a first operational amplifier, further comprising the steps of:
receiving, at a second-operational-amplifier non-inverting terminal of a second operational amplifier, a second-operational-amplifier non-inverting terminal reference voltage;
receiving, at a second-operational-amplifier inverting terminal of the second operational amplifier, a second-operational-amplifier inverting terminal voltage based at least in part on the operating current; and
in response to the second-operational-amplifier inverting terminal voltage exceeding the second-operational-amplifier non-inverting terminal reference voltage:
transmitting, from a second-operational-amplifier output terminal of the second operational amplifier, a second-operational-amplifier output terminal current through a light-emitting diode and causing the light-emitting diode to emit light.

25. The method of claim 24, wherein the second-operational-amplifier non-inverting terminal reference voltage is set such that the light-emitting diode emits light before the high-linear amplifier stage enters a non-linear mode.

26. The method of claim 24, wherein:
the first plurality of signals comprises a plurality of process signals and a plurality of interference signals;
the operating current is based at least in part on the plurality of interference signals; and
the light-emitting diode emits light in response to a signal level of the plurality of interference signals exceeding a specified interference-signal-level threshold value.

27. The method of claim 26, wherein the plurality of process signals comprises a plurality of global navigation satellite signals.

28. The method of claim 19, wherein:
the operational amplifier is a first operational amplifier;
the high-linear amplifier stage is a portion of a low-noise amplifier;
the low-noise amplifier is coupled to a receiver by a coax cable;
the low-noise amplifier is configured to receive direct-current power from the receiver via the coax cable;
the receiver comprises a direct-current power supply having a direct-current-power-supply output terminal; and
the method further comprises the steps of:
transmitting, from the direct-current-power-supply output terminal to the low-noise amplifier, a supply current, wherein variations in the supply current are substantially based on variations in the operating current;
receiving, at a second-operational-amplifier non-inverting terminal of a second operational amplifier, a second-operational-amplifier non-inverting terminal reference voltage;
receiving, at a second-operational-amplifier inverting terminal of the second operational amplifier, a second-operational-amplifier inverting terminal voltage based at least in part on the supply current; and
in response to the second-operational-amplifier inverting terminal voltage exceeding the second-operational-amplifier non-inverting terminal reference voltage:
transmitting, from a second-operational-amplifier output terminal of the second operational amplifier, a second-operational-amplifier output signal to a signal-level indicator and causing the signal-level indicator to output an indicator signal that indicates that the supply current exceeds a specified supply-current threshold value.

29. The method of claim 28, wherein the signal-level indicator comprises:
a light-emitting diode;
an audible alarm; or
a visual display.

30. The method of claim 28, wherein:
the first plurality of signals comprises a plurality of process signals and a plurality of interference signals;
the operating current is based at least in part on the plurality of interference signals; and
the signal-level indicator outputs the indicator signal in response to a signal level of the plurality of interference signals exceeding a specified interference-signal-level threshold value.

31. The method of claim 30, wherein the plurality of process signals comprises a plurality of global navigation satellite signals.

32. The method of claim 19, further comprising the steps of:
sending a second plurality of signals to a second bandpass filter, wherein:
the second plurality of signals is based at least in part on the directional-coupler output signal;
the second bandpass filter has a second low cutoff frequency and a second high cutoff frequency;
the second low cutoff frequency is greater than the first low cutoff frequency; and
the second high cutoff frequency is less than the first high cutoff frequency;
receiving, at the directional-coupler output terminal, a third plurality of signals reflected back from the second bandpass filter;

transmitting a first portion of the third plurality of signals to the directional-coupler incident terminal; and transmitting a second portion of the third plurality of signals to a directional-coupler load terminal of the directional coupler.

33. The method of claim 19, wherein the first plurality of signals comprises:

a plurality of process signals; and a plurality of interference signals.

34. The method of claim 33, wherein the plurality of process signals comprises a plurality of global navigation satellite signals.

35. The method of claim 32, wherein:

the first low cutoff frequency is 1100 MHz;

the first high cutoff frequency is 1350 MHz;

the second low cutoff frequency is 1160 MHz; and the second high cutoff frequency is 1300 MHz.

36. The method of claim 32, wherein:

the first low cutoff frequency is 1500 MHz;

the first high cutoff frequency is 1640 MHz;

the second low off frequency is 1530 MHz; and the second high cutoff frequency is 1620 MHz.

* * * * *